US011590527B2

(12) United States Patent
O'Shaughnessy et al.

(10) Patent No.: US 11,590,527 B2
(45) Date of Patent: Feb. 28, 2023

(54) SYSTEMS, METHODS, AND ARTICLES FOR POLYMER DEPOSITION

(71) Applicant: GVD Corporation, Cambridge, MA (US)

(72) Inventors: W. Shannan O'Shaughnessy, Watertown, MA (US); Andrew Grant, Lexington, MA (US); Kelli J. Byrne, South Boston, MA (US); Michael E. Stazinski, Roslindale, MA (US); Hilton Pryce Lewis, Lexington, MA (US)

(73) Assignee: GVD Corporation, Cambridge, MA (US)

( * ) Notice: Subject to any disclaimer, the term of this patent is extended or adjusted under 35 U.S.C. 154(b) by 109 days.

(21) Appl. No.: 16/858,549

(22) Filed: Apr. 24, 2020

(65) Prior Publication Data
US 2021/0331198 A1    Oct. 28, 2021

(51) Int. Cl.
*B05D 1/00* (2006.01)
*B05C 11/06* (2006.01)

(52) U.S. Cl.
CPC ............... *B05C 11/06* (2013.01); *B05D 1/60* (2013.01); *B05D 2506/15* (2013.01)

(58) Field of Classification Search
CPC ............................. B05D 1/60; B05D 2506/15
See application file for complete search history.

(56) References Cited

U.S. PATENT DOCUMENTS

| | | | |
|---|---|---|---|
| 5,146,481 A | 9/1992 | Garg et al. | |
| 5,888,591 A | 3/1999 | Gleason et al. | |
| 8,916,001 B2 | 12/2014 | Pryce Lewis et al. | |
| 10,964,509 B2 | 3/2021 | Song | |
| 2007/0235890 A1 | 10/2007 | Pryce Lewis et al. | |
| 2008/0041836 A1* | 2/2008 | Gralenski | F27B 9/06 219/156 |
| 2010/0294658 A1 | 11/2010 | Pei | |
| 2012/0003497 A1* | 1/2012 | Handy | G01B 11/16 118/712 |
| 2013/0323423 A1 | 12/2013 | Nakaya et al. | |
| 2013/0344247 A1 | 12/2013 | Ueyama et al. | |
| 2017/0358445 A1 | 12/2017 | O'Shaughnessy et al. | |
| 2018/0211862 A1 | 7/2018 | Konkola et al. | |
| 2018/0355475 A1* | 12/2018 | Grant | C23C 16/44 |
| 2018/0366302 A1 | 12/2018 | Sun et al. | |
| 2020/0051789 A1 | 2/2020 | Linebarger, Jr. et al. | |

FOREIGN PATENT DOCUMENTS

CN   105039927 A   11/2015

OTHER PUBLICATIONS

U.S. Appl. No. 15/977,481, filed May 11, 2018, Grant et al.
U.S. Appl. No. 16/858,547, filed Apr. 24, 2020, O'Shaughnessy et al.

(Continued)

*Primary Examiner* — Dah-Wei D. Yuan
*Assistant Examiner* — Kristen A Dagenais-Englehart
(74) *Attorney, Agent, or Firm* — Pabst Patent Group LLP

(57) ABSTRACT

Systems having one or more features that are advantageous for depositing fluorinated polymeric coatings on substrates, and methods of employing such systems to deposit such coatings, are generally provided.

14 Claims, 5 Drawing Sheets

(56) References Cited

OTHER PUBLICATIONS

U.S. Appl. No. 16/858,551, filed Apr. 24, 2020, O'Shaughnessy et al.
PCT/US2018/032262, Oct. 29, 2018, International Search Report and Written Opinion.
International Search Report and Written Opinion for PCT/US2021/027394 dated Aug. 5, 2021.
PCT/US2021/027394, Aug. 5, 2021, International Search Report and Written Opinion.
International Search Report and Written Opinion for PCT/US2018/032262 dated Oct. 29, 2018.

* cited by examiner

SYSTEMS, METHODS, AND ARTICLES FOR POLYMER DEPOSITION

FIELD

Systems and methods for depositing fluorinated polymers onto substrates are generally provided.

BACKGROUND

Chemical vapor deposition may be employed to deposit fluorinated polymeric coatings. However, some systems employed to perform such processes may exhibit one or more drawbacks that result in uneven coatings, inconsistent coatings, and/or that require undesirably frequent repair and/or adjustment.

Accordingly, improved systems and methods for depositing fluorinated polymeric coating are needed.

SUMMARY

The present disclosure generally provides systems for depositing fluorinated polymeric coatings onto substrates and related methods. The subject matter described herein involves, in some cases, interrelated products, alternative solutions to a particular problem, and/or a plurality of different uses of one or more systems and/or articles.

In some embodiments, a method is provided. The method comprises applying a voltage and a tensile force to a filament taking the form of a wire. The wire is positioned in a reaction volume comprising at most 10 mTorr of air and comprising hexafluoropropylene oxide vapor. The reaction volume is positioned in a deposition chamber. The voltage causes the wire to increase in temperature. The wire heats the hexafluoropropylene oxide vapor, thereby causing it to decompose. A ratio of the applied tensile force to a rated tensile strength of the material forming the wire is greater than or equal to 0.6 at a temperature of the filament.

In some embodiments, a method comprises passing a current through a filament taking the form of a wire to resistively heat the wire, sensing a resistance of the wire, and, if the resistance of the wire is greater than or equal to 101% or less than or equal to 99% of a set point, adjusting a voltage applied to the wire. The wire is positioned at least partially inside a reaction volume. The reaction volume is positioned in a deposition chamber. The reaction volume comprises at most 10 mTorr of air and comprises hexafluoropropylene oxide vapor. The wire heats the hexafluoropropylene oxide vapor, thereby causing it to decompose.

In some embodiments, a method comprises sensing a resistance of a wire, and, if the resistance of the wire is greater than or equal to 101% or less than or equal to 99% of a set point, providing a warning. The wire is positioned at least partially inside a reaction volume. The reaction volume is positioned in a deposition chamber. The reaction volume comprises at most 10 mTorr of air and comprises hexafluoropropylene oxide vapor. The wire heats the hexafluoropropylene oxide vapor, thereby causing it to decompose.

In some embodiments, a system is provided. The system comprises a deposition chamber comprising a reaction volume and a filament positioned at least partially inside the reaction volume. The reaction volume is capable of comprising hexafluoropropylene oxide vapor and being evacuated of air by a source of vacuum. The filament takes the form of a wire configured to increase in temperature upon the application of a voltage thereto. The filament is configured to heat the hexafluoropropylene oxide vapor, thereby causing it to decompose. The filament is capable of being stably positioned at a first location. The filament is capable of being stably positioned at a second location. The second location is different from the first location. The filament is incapable of being stably positioned at a third location positioned between the first location and the second location.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Systems having one or more features that are advantageous for depositing fluorinated polymeric coatings on substrates, and methods of employing such systems to deposit such coatings, are generally provided. Some components described herein have features that are advantageous when provided absent other components also described herein, and some combinations of two or more components described herein interact in a manner to provide synergistic benefits to the system as a whole.

Figure 1:
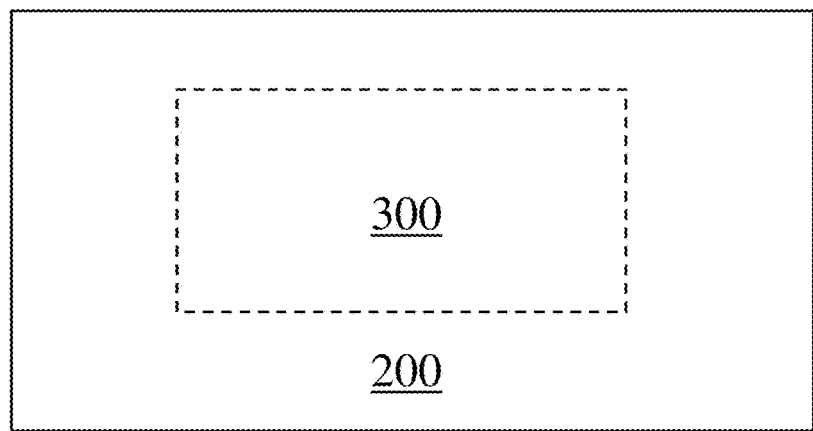
FIG. 1 shows a system comprising a deposition chamber and a reaction volume, in accordance with some embodiments.

The systems described herein generally comprise a plurality of components that together allow a fluorinated polymeric coating to be deposited on a substrate. These components typically include a deposition chamber comprising a reaction volume in which the fluorinated polymer is formed. FIG. 1 shows one non-limiting embodiment of a top view of a system having these components. In FIG. 1, the system 100 comprises a deposition chamber 200 comprising a reaction volume 300.

Figure 2:
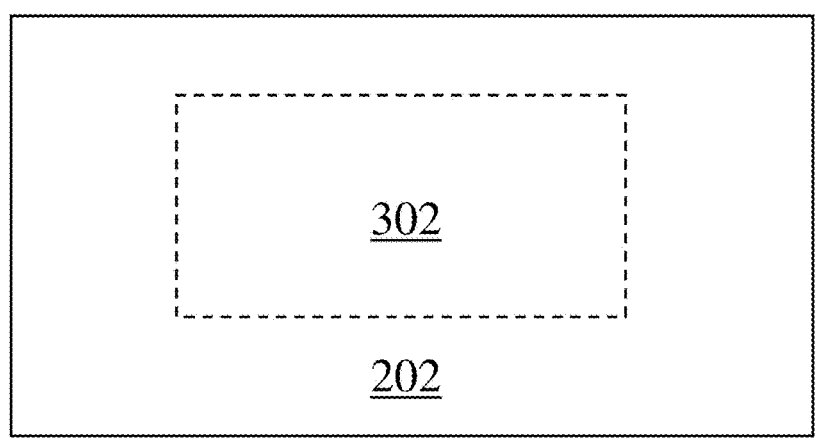
FIG. 2 shows a system comprising two sources, in accordance with some embodiments.

A system may also comprise one or more sources that, when in fluidic communication with the reaction volume, may be configured to introduce one or more species into and/or remove one or more species from the reaction volume. FIG. 2 shows a system comprising two such sources: a first source 402 and a second source 502. Each of the first and second sources may independently be configured to introduce one or more species into and/or remove one or more species from the reaction volume. For instance, in some embodiments, the first and/or second sources are configured to supply a reagent and/or combination of reagents to the reaction volume. The reagent(s) may be supplied in the presence of one or more non-reactive species (e.g., a carrier gas, such as an inert carrier gas) or may be provided as pure component(s). When two or more reagents are supplied, they may all be supplied together (e.g., in a single, pre-mixed stream), they may all be supplied separately (e.g., in separate streams), or there may exist at least one reagent that is supplied together with at least one other reagent and separately from at least one other reagent.

As another example, in some embodiments, first and/or second sources are configured to allow and/or promote the removal of one or more species undesirable for inclusion in the reaction volume. The removal of such species may be accomplished by removing all of the gaseous species in the reaction volume together (e.g., the source may be a source of vacuum). It is also possible for a system to be configured such that one or more species are selectively removed from the reaction volume. For instance, a solid adsorbent may be configured to remove one or more species that adsorb thereon (e.g., water) but not remove one or more species that do not adsorb thereon.

It is also possible for a system to comprise further components that promote the reaction of any reagents introduced into the reaction volume. As one example, in some embodiments, a system further comprises a filament. It is also possible for a system to, additionally, or alternatively, comprise a source of plasma (e.g., a source of radiofrequency plasma) and/or a lamp (e.g., an ultraviolet lamp). When present, the filament (and/or source of plasma and/or lamp) may be configured to and/or capable of providing energy, such as heat, to the reaction volume. This energy may initiate a reaction in the reaction volume, such as a reaction that causes the deposition of a fluorinated polymeric coating on a substrate. It is also possible for energy provided by a filament (and/or by another energy source), such as heat, to catalyze a reaction in the reaction volume. As one specific example, in some embodiments, the filament may comprise a wire that may heat a monomer, a precursor to a monomer, and/or an initiator. The heat may cause the monomer to undergo a polymerization reaction, may cause the precursor to the monomer to decompose (e.g., into a monomer), and/or may cause the initiator to decompose (e.g., thereby activating it). The heating may be accomplished by a variety of suitable manners, including resistively. For example, the filament may be connected to a DC voltage source and electrical ground.

Figure 3:
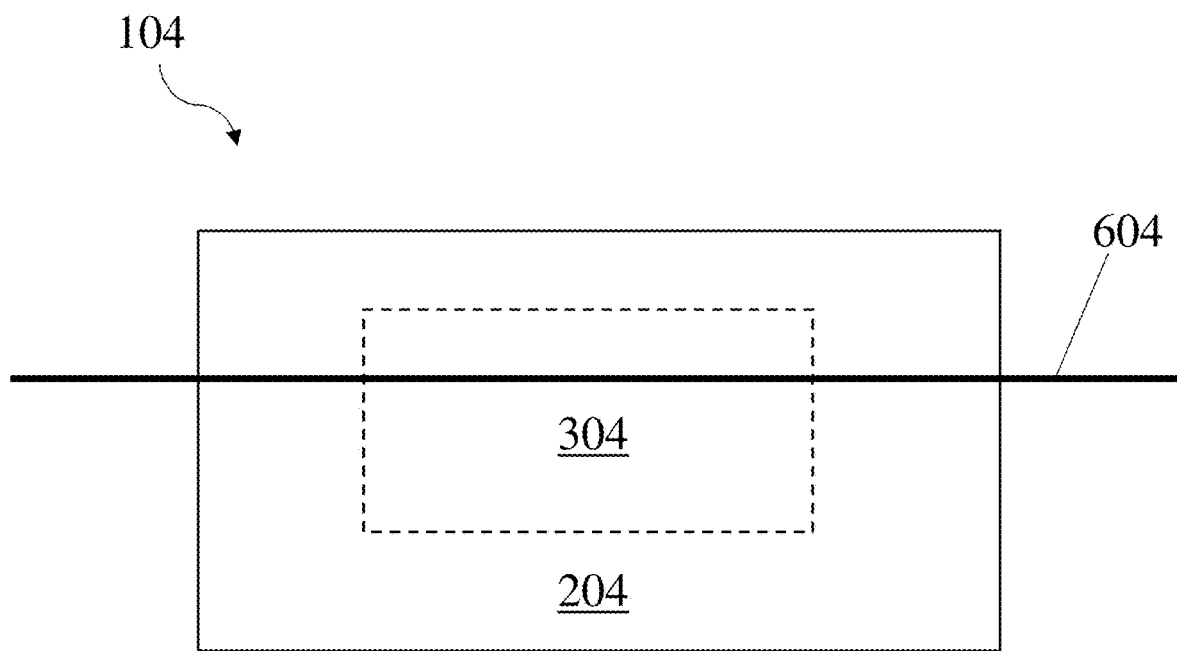
FIG. 3 shows a system comprising a filament, in accordance with some embodiments.

In some embodiments, a system comprises a filament that takes the form of a wire. A potential difference may be established across the wire, causing current to flow from one end to the other and causing the filament to heat due to resistive losses. In other words, a voltage may be applied to the wire to increase its temperature and/or the wire may be configured to increase in temperature upon the application of a voltage thereto. FIG. 3 shows one non-limiting embodiment of a system comprising a filament taking the form of a wire (labeled as element 604). Although not shown in FIG. 3, systems may comprise two or more filaments. Such filaments, if taking the form of wires, may comprise wires that are parallel to each other and/or may comprise wires that are not parallel to each other. Similarly, such filaments may comprise wires positioned at the same height with respect to the base of the reaction volume and/or may comprise wires positioned at different heights with respect to the base of the reaction volume.

As also not shown in FIG. 3, systems comprising a filament may further comprise one or more sources (e.g., like the sources shown in FIG. 2). Source(s) configured to introduce gases (e.g., monomers, precursors to monomer, initiators, carrier gases) into the reaction volume may be configured to introduce gases such that they enter and/or flow through the reaction volume at a variety of angles to the filament. By way of example, if the filament takes the form of a wire, the source(s) may be configured to introduce the gases such that they enter and/or flow through the reaction volume in a direction parallel to the wire, perpendicular to the wire, or at any angle in between. In systems comprising two or more sources, different sources may be configured to introduce gases into the reaction volume into the reaction volume such that they enter and/or flow through the reaction volume in the same direction and/or in different directions. Similarly, in systems comprising two or more sources, different sources may be configured to introduce gases into the reaction volume into the reaction volume such that they enter and/or flow through the reaction volume in the same location and/or in different locations. For instance, if a system comprises two or more sources and two or more filaments taking the form of wires, different sources may be configured to direct different gases towards different wires.

It should be noted that, as described in further detail below some sources may be separated from a reaction volume by a port or another system component. In such cases, the source itself may be configured to introduce the gas in the relevant manner, the port or other system component may be configured to introduce the gas in the relevant manner, and/or the source and port or other system component may together be configured to introduce the gas in the relevant manner. In some embodiments, a source may be separated from the reaction volume by a system component that is configured to split the gas provided by the source into two or more streams and introduce at least some of the streams into the reaction volume at different locations and/or such that they flow in different directions from each other.

Systems may also provide further components and/or components similar to those shown in FIGS. 1-3 but differing in one or more ways. Further details regarding such system components are provided below.

Figure 4:
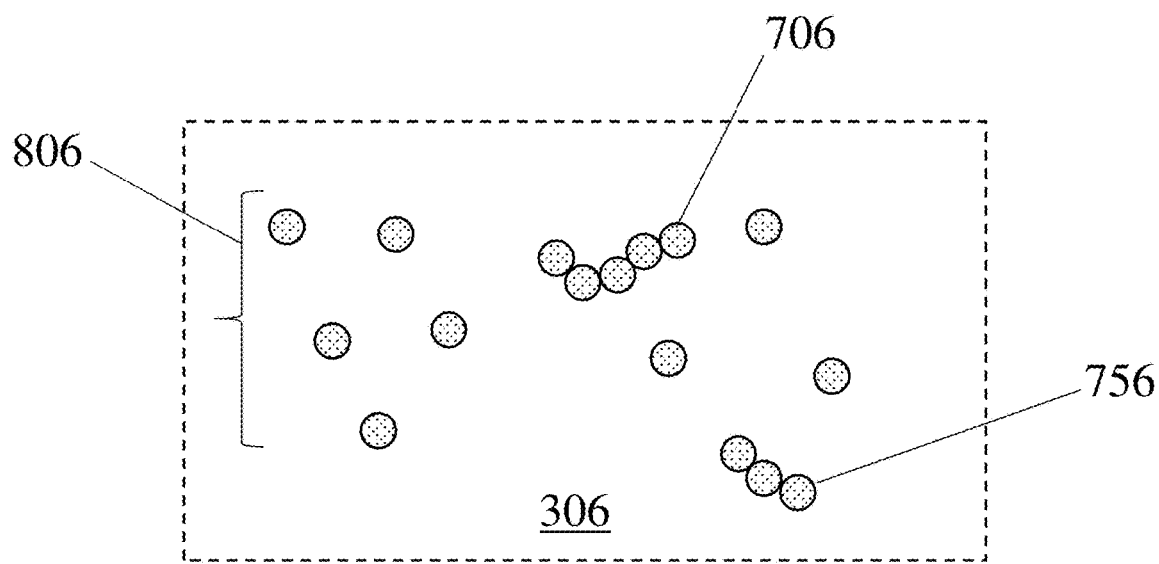
FIG. 4 shows a reaction occurring inside a reaction volume, in accordance with some embodiments.

As described elsewhere herein, the systems described herein may be suitable for depositing fluorinated polymeric coatings on a substrate. The fluorinated polymeric coatings may be formed in a reaction volume from fluorinated monomers introduced thereinto (e.g., by a source, by a chemical reaction of a precursor to a monomer introduced thereinto). Once inside the reaction volume, the monomers may undergo a polymerization reaction to form the fluorinated polymer. FIG. 4 shows one example of a reaction incurring inside a reaction volume. In FIG. 4, two polymers 706 and 756 form in the reaction volume 306 from the monomers 806. Polymerization may occur at a variety of suitable locations inside the reaction volume. In some embodiments, like the embodiment shown in FIG. 4, the polymerization occurs in an environment surrounded by gas (e.g., including gaseous monomer and/or one or more carrier gases). It is also possible for the polymerization to occur on a surface (e.g., on a base and/or wall enclosing the reaction volume, on a substrate being coated).

Figure 5:
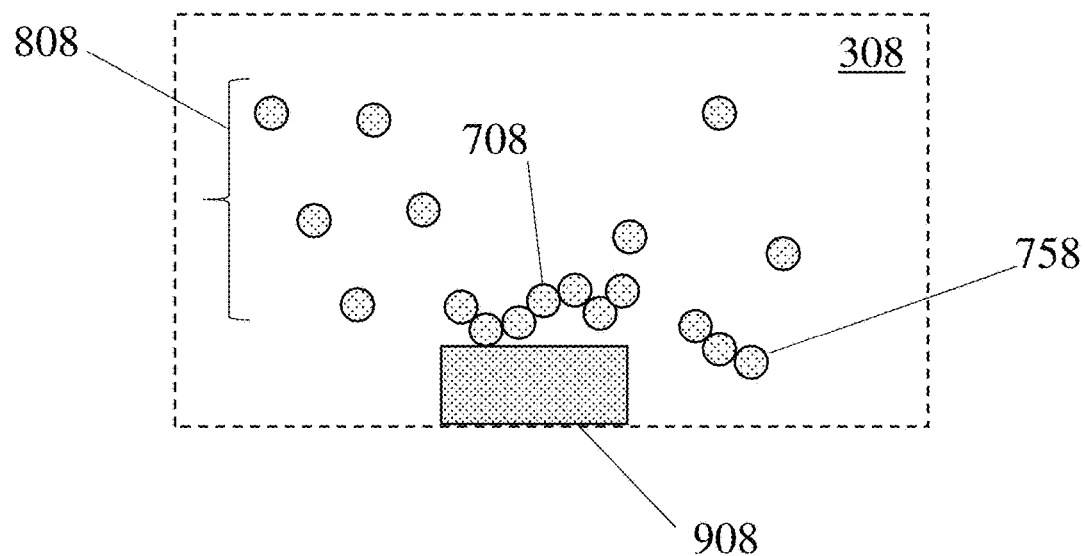
FIG. 5 shows a deposition process in which a polymer initially formed in a gas deposits onto a surface of a substrate and thereby coats the substrate, in accordance with some embodiments.

Polymers, if formed when surrounded by gas, may eventually deposit onto a surface (e.g., of a substrate being coated) once they achieve sufficient molecular weight to form a particle. FIG. 5 shows one example of a deposition process in which a polymer initially formed in a gas (e.g., surrounded on all sides by a gas) deposits onto a surface of a substrate and thereby coats the substrate. In FIG. 5, the polymer 708 has grown from the polymer 706 shown in FIG. 4 so that its molecular weight has increased by two monomers. This has caused the polymer 708 to form a particle that deposits from the gaseous environment in the reaction volume 308 onto the substrate 908. The polymer 758 has not increased in molecular weight, and so it remains gaseous and does not deposit onto the substrate 908.

It should also be understood that, in some embodiments, a polymer that increases in molecular weight may nucleate a particle that stays suspended in a gaseous interior of a reaction volume for a period of time before depositing onto a surface. The particle may serve as a nucleation site for other polymer chains and/or other growing polymer chains may agglomerate with the particle. Once the resultant particle is of a sufficient size to no longer be suspended in the gaseous environment, it may deposit onto a surface (e.g., of a substrate being coated). Deposition that occurs in this manner may result in the formation of a coating that has a morphology comprising agglomerated particles.

Like for the systems described above, the processes for depositing polymeric coatings on substrates may comprise one or more further steps and/or differ from the processes described above in one or more ways. Having now provided an overview of an exemplary system that may be employed to form fluorinated polymeric coatings and an exemplary process by which such coatings may be formed, further details regarding components that may be employed in such exemplary systems and methods that such exemplary systems may be employed to perform are described in further detail below.

Figure 6:
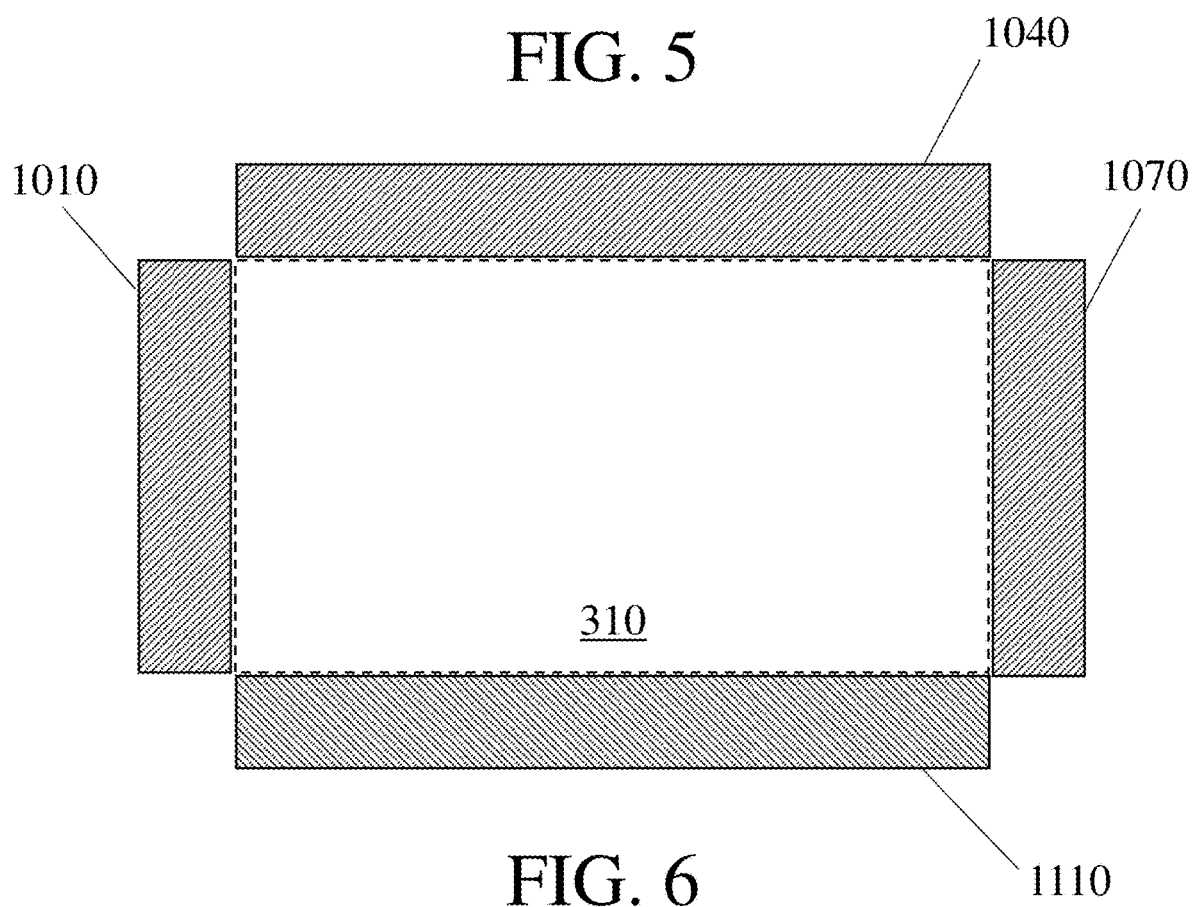
FIG. 6 shows a reaction volume enclosed by a plurality of walls and a base, in accordance with some embodiments.

As described elsewhere herein, in some embodiments, a system comprises a reaction volume. The reaction volume may be enclosed by a plurality of walls and a base. FIG. 6 shows one non-limiting embodiment of a cross-section of a reaction volume having this property. In FIG. 6, the reaction volume 310 is enclosed by the walls 1010, 1040, and 1070 and by the base 1110. The walls and the base may be the walls and the base of a deposition chamber in which the reaction volume is positioned. In other words, the deposition chamber may enclose the reaction volume and the interior of the deposition chamber may be identical to the interior of the reaction volume. It is also possible for the walls and the base enclosing the reaction volume to be positioned interior to the deposition chamber. In other words, the deposition chamber may enclose the walls and the base, and these walls and base may enclose the reaction volume. In such embodiments, the deposition chamber may further enclose other components of the system, such as portions of one or more filaments not positioned in the reaction volume, portions of one or more components of a cooling system not positioned in the reaction volume, motors, electrical components, and/or other system components not suitable for inclusion in the reaction volume and/or that may be advantageously excluded from the reaction volume.

In some embodiments, one or more of the walls and/or the base enclosing a reaction volume may be capable of undergoing one or more types of motion. For instance, in some embodiments, one, some, or all of the walls may be moveable. As another example, the base may be movable. It is also possible for a wall or a base to comprise one or more portions that are movable and one or more portions that are not movable. Moving one or more of the walls and/or the base (and/or one or more portions thereof) may change the size of the reaction volume. By way of example, moving a wall and/or a base (and/or one or more portions thereof) towards the center of the reaction volume may make the reaction volume smaller. Similarly, moving a wall and/or a base (and/or one or more portions thereof) away from the center of the reaction volume may make the reaction volume larger. When a wall and/or a base comprises two or more portions that are movable, the portions may be movable separately from each other and/or may be movable together. The portions may be directly adjacent to each other or may be separated from each other by an unmovable portion. The movable portions may be next to each other, or one portion may be positioned around another portion (e.g., surrounding the other portion on all sides, surrounding the other portion around a majority but not all of its edges).

The ability to adjust the size of the reaction volume may be advantageous when it is desirable to use the system to deposit coatings onto substrates having a variety of sizes. For instance, it may be desirable to use a relatively small reaction volume to deposit a coating onto a relatively small substrate, as this may minimize the amount of reagent needed to form the coating and/or may promote the formation of a relatively large percentage of the deposited coating on the substrate (e.g., instead of the base and/or walls). As another example, it may be necessary to use a larger reaction volume to coat a larger substrate, as it is desirable for the reaction volume to be of sufficient size to enclose the substrate. As a third example, in some embodiments, it may be desirable to change the size of the reaction volume when the reaction volume is being used for different types of processes. For instance, it may be desirable for the reaction volume to be smaller when the system is being employed to perform smaller, testing runs. Later, during production runs, it may be desirable to coat larger substrates and/or more substrates during a single run, making a larger reaction volume desirable. Employing the same reaction volume for both processes may facilitate maintaining similar reaction conditions during both processes.

It is also possible that other advantages may flow from the ability to adjust the size of the reaction volume. For instance, in some embodiments, adjusting the reaction volume may cause one or more features of the reaction(s) taking place therein to change, and so the ability to adjust the size of a reaction volume may allow an operator to adjust one or more features of such reaction(s) and/or one or more features of a fluorinated polymeric coating formed by such reaction(s) (e.g., its morphology, molecular weight, uniformity, and/or conformality). As one example, adjusting the reaction volume by moving the base upwards may bring the base closer to the portion(s) of the filament(s) positioned inside the reaction volume, which may affect any reaction(s) catalyzed by the heat provided by the filament(s). Accordingly, the ability to adjust the size of the reaction volume in a relatively facile, rapid, and/or economic manner may advantageously allow an operator to adjust reaction conditions in such a manner.

In some embodiments, a base and/or a portion of a base may be rotatable. It is also possible for a base to comprise one or more portions that are rotatable and one or more portions that are not rotatable. When a base comprises two or more portions that are rotatable, the portions may be rotatable separately from each other (e.g., at different points in time) and/or may be rotatable together (e.g., simultaneously). The portions may be directly adjacent to each other or may be separated from each other by an unrotatable portion. The portions may be next to each other, or one portion may be positioned around another portion (e.g., surrounding the other portion on all sides, surrounding the other portion around a majority but not all of its edges).

When a base and/or a portion of a base is rotatable, the axis of rotation may generally be selected as desired. In some embodiments, the axis of rotation is perpendicular to the base and/or the rotatable portion of the base. The axis of rotation may pass through the center of the base and/or the rotatable portion thereof, or may be off-center.

Without wishing to be bound by any particular theory, it is believed that rotating the base (and/or a portion thereof) may advantageously promote the deposition of a uniform coating on a substrate positioned on the base and/or uniform coatings on a plurality of substrates positioned on the base. As the base (and/or portion thereof) rotates, it may move any substrate(s) positioned thereon in an arc about the axis of rotation, which may exposing the substrate(s) sequentially to different portions of the reaction volume. If some portions of the reaction volume differ from one another such that the fluorinated polymer being formed therein differs, such rotation may substantially reduce and/or prevent the deposition of a coating that varies across the substrate and/or substrates. By way of example, as a substrate is moved through the reaction volume by the rotation of the base, it (and its portions) may be exposed sequentially to these differing portions of the reaction volume and may accumulate a coating comprising a fluorinated polymer in these differing portions of the reaction volume. The resultant coating in each portion of the substrate may be an "average" of coating being formed at the various locations in the reaction volume, and so the coating as a whole may be uniform even if the reaction from which it forms varies across the reaction volume.

A rotatable base may be capable of undergoing a variety of different types of rotation. In some embodiments, the rotatable base is only capable of rotating in one direction (e.g., clockwise, counterclockwise). It is also possible for a rotatable base to be configured to rotate in only one direction. For instance, the system may comprise software that instructs the base to only rotate in one direction. In some embodiments, the base may be capable of and/or configured to rotate continuously (e.g., for a set period of time, indefinitely) and/or without operator intervention. As one example, a base may be provided with software that can rotate the base autonomously without active operator involvement.

A rotatable base may be capable of rotating at a variety of suitable rates. In some embodiments, the rate of rotation is selected such that, over the course of a deposition process performed in a reaction volume, the rotatable base undergoes exactly one complete rotation or undergoes an integer multiple of complete rotations. In some embodiments, the rate of rotation is greater than or equal to 0.1 rpm, greater than or equal to 0.2 rpm, greater than or equal to 0.5 rpm, greater than or equal to 0.75 rpm, greater than or equal to 1 rpm, greater than or equal to 2 rpm, greater than or equal to 5 rpm, or greater than or equal to 7.5 rpm. In some embodiments, the rate of rotation is less than or equal to 10 rpm, less than or equal to 7.5 rpm, less than or equal to 5 rpm, less than or equal to 2 rpm, less than or equal to 1 rpm, less than or equal to 0.75 rpm, less than or equal to 0.5 rpm, or less than or equal to 0.2 rpm. Combinations of the above-referenced ranges are also possible (e.g., greater than or equal to 0.1 rpm and less than or equal to 10 rpm). Other ranges are also possible.

In some embodiments, a system is configured such that one or more of the walls and/or the base of the reaction volume are capable of being removed and/or replaced. It is also possible for one or more walls and/or the base to comprise one or more portions that are capable of being removed and/or replaced and to comprise one or more portions that are incapable of being removed and/or replaced. As one example, in some embodiments, a system is configured such that the base and/or a portion of the base is removable. This may be desirable for embodiments in which it is advantageous to use different types of bases for different types of processes. For instance, in some embodiments, it may be desirable to be able to reversibly switch between a rotating base and a non-rotating base. When a base and/or walls are removable, they may be configured to be removed and/or replaced relatively quickly. For instance, in some embodiments, one wall may be replaced with another and/or one base may be replaced with another over a period of seconds and/or minutes.

In some embodiments, a system comprises a base (e.g., a rotatable base, a non-rotatable base) and/or one or more walls that is capable of being heated, cooled, and/or maintained at a temperature within a particular range. For instance, a base and/or one or more of the walls that enclose a reaction volume may be capable of being heated, cooled, and/or maintained at a temperature within a particular range. As another example, a base and/or one or more of the walls of a deposition chamber (e.g., a deposition chamber enclosing a base and one or more walls that enclose a reaction volume) may be capable of being heated, cooled, and/or maintained at a temperature within a particular range. In some embodiments, the base and/or wall(s) may be in thermal communication with a cooling system and/or a heating system. For instance, the base and/or wall(s) may be cooled and/or heated by flowing a cooled and/or heated fluid across a surface of the base and/or (wall(s) (e.g., a surface opposite a surface on which a substrate is positioned) and/or through the interior of the base and/or wall(s). One example of a suitable fluid for this purpose is water. In some embodiments, the base and/or wall(s) may be cooled and/or heated electrically. For instance, the base and/or wall(s) may be resistively heated. As another example, heat may be provided to the base and/or wall(s) and/or removed from the base and/or wall(s) by use of Peltier cooling system.

It should also be noted that the base and/or wall(s) may be directly heated and/or cooled, and/or may be indirectly heated and/or cooled. Direct heating and/or cooling may comprise heating and/or cooling the base and/or walls directly by one or more of the methods described in the preceding paragraph. Indirectly heating and/or cooling may comprise directly heating and/or cooling an article other than the base or walls by one or more of the methods described in the preceding paragraph, and contacting the base and/or walls with the directly-heated and/or -cooled article.

It should be noted that it is also possible for a cooling element to be disposed on the base, an embodiment that is described further elsewhere herein. In other words, in some embodiments the base itself is heated and/or cooled and no further cooling element is provided, in some embodiments the base itself is neither heated nor cooled and a cooling element is disposed on the base to cool a substrate positioned thereon, in some embodiments the base itself is heated and/or cooled and a further cooling element is disposed on the base to cool a substrate positioned thereon, and in some embodiments the base is neither heated nor cooled and no cooling element is provided.

In some embodiments, the walls and the base enclose the reaction volume such that the reaction volume is not in fluidic communication with an environment exterior to the reaction volume. The reaction volume may be isolated in this manner at some points in time, but not others. For instance, the reaction volume may be isolated in this manner when in fluidic communication with a source of vacuum and/or during a reaction (e.g., a polymerization reaction) performed in the reaction volume. The isolation of the reaction volume may be accomplished by employing a plurality of walls and a base that are gas-tight and that are joined by gas-tight connections. In some embodiments, the isolation of the reaction volume is accomplished (and/or gas transport out of the reaction volume is reduced) by introducing gas into the reaction volume in a manner such that it is directed away from any openings and/or potential sources of gas leakage.

As described elsewhere herein, in some embodiments, a filament and/or plurality of filaments passes through a reaction volume. The filament(s) may be entirely contained within the reaction volume and/or may comprise some portions that are outside of the reaction volume. Similarly, the filament(s) may be entirely contained within the deposition chamber and/or may comprise some portions that are outside of the deposition chamber.

Figure 7:
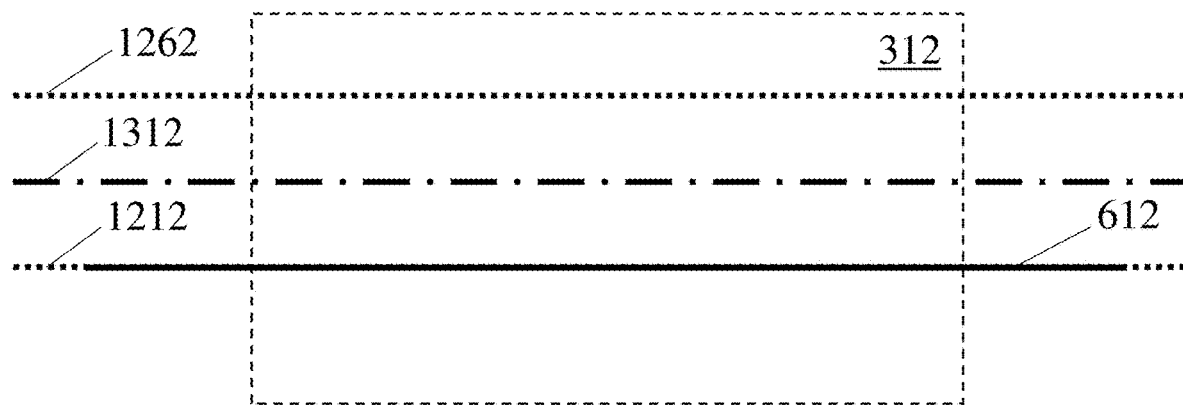
FIG. 7 shows a reaction volume comprising a portion of a filament, in accordance with some embodiments.

In some embodiments, a filament and/or plurality of filaments is positioned such that the filament(s) can be moved facilely from one location to another. As an example, in some embodiments, a system may be configured such that the filament can be positioned at two or more discrete locations inside a reaction volume and/or can be moved between two or more discrete locations inside the reaction volume in a relatively easy manner. For instance, in some embodiments, there may be two or more stable locations inside the reaction volume at which the filament may be positioned, and one or more unstable locations between the two or more stable locations. The filament may be incapable of being positioned stably at the unstable location(s). For instance, with reference to FIG. 7, a filament 612 may be capable of being positioned stably at the stable locations 1212 and 1262 but incapable of being stably positioned at the unstable location 1312 positioned between the two stable locations 1212 and 1262. FIG. 7 shows a cross-sectional view of a reaction volume 312.

A filament that is positioned stably at a location may be positioned such that, absent the application of a force to the filament by an operator, it may remain in that location indefinitely. In some embodiments, a filament is positioned stably at a location such that, after undergoing a small perturbation that removes it from the location, it returns to the location without any additional force applied by the operator. It is also possible for a filament to be positioned stably at a location such that it remains there even under the application of forces having small values applied by an operator.

A filament that is positioned unstably at a location may be positioned such that, absent the application of a force to the filament by the operator, it translates from that location to another location (e.g., to a location at which it is stably positioned). In some embodiments, a filament is positioned unstably at a location such that, after undergoing a small perturbation that removes it from that location, it translates to another location (e.g., to a location at which it is stably positioned) and/or does not return to the location at which it was previously unstably positioned. It is also possible for a filament to be positioned unstably at a location such that it will not remain there even under the application of forces having small values applied by an operator.

Without wishing to be bound by any particular theory, it is believed that limiting the stable positions of a filament to one or more defined and/or pre-determined locations may be advantageous. For instance, it is believed that this property may allow operators to employ the system in a relatively predictable and/or reproducible manner. As an example, an operator may initially position the filament(s) such that they are located at one or more of the stable location(s). Then, the operator may use the system to deposit a fluorinated polymer while the filament(s) are positioned at the same stable location(s). The stability of the locations may allow the operator to have good control over the position of the filament because the operator may be able to trust that the filament(s) do not move after initial placement. Additionally, in some embodiments, the filament(s) may be retained at their stable location(s) between uses of the system. This may assist an operator with employing the system such that it has the same, unaltered configuration during multiple sequential runs. As a third example, in some embodiments, an operator may use consistent but differing stable location(s) for different processes. For instance, an operator may employ one stable location for one type of substrate to be coated and another, different stable location for coating a second, different type of substrate. The operator (and/or software provided with the system) may take note of the different stable locations employed and may select the appropriate and reproducible stable location for a substrate after it has been loaded.

In some embodiments, a system comprises a racking system that assists with defining stable and unstable locations for one or more filament(s) at least partially positioned inside a reaction volume. The racking system may be configured such that it can has certain stable configurations and certain unstable configurations (e.g., positioned between the stable configurations). As an example, in some embodiments, a racking system may comprise gears, a ratchet and pawl combination, stationary filament supports (e.g., slots, clamps, etc.), and/or another component and/or combination of components that together may cause this result. In some embodiments, the racking system is configured such that the stable locations for the filaments are separated by a uniform distance. In other words, the filament(s) may be capable of being positioned at a plurality of stable locations, and the distance between each stable location and its nearest neighbor may be relatively uniform.

When present, stable locations for filament(s) may be separated by a variety of suitable average distances. In some embodiments, the stable locations are separated by an average distance of greater than or equal to 0.1 mm, greater than or equal to 0.2 mm, greater than or equal to 0.5 mm, greater than or equal to 0.75 mm, greater than or equal to 1 mm, greater than or equal to 2 mm, greater than or equal to 5 mm, greater than or equal to 7.5 mm, greater than or equal to 10 mm, greater than or equal to 20 mm, greater than or equal to 50 mm, or greater than or equal to 75 mm. In some embodiments, the stable locations are separated by an average distance of less than or equal to 100 mm, less than or equal to 75 mm, less than or equal to 50 mm, less than or equal to 20 mm, less than or equal to 10 mm, less than or equal to 7.5 mm, less than or equal to 5 mm, less than or equal to 2 mm, less than or equal to 1 mm, less than or equal to 0.75 mm, less than or equal to 0.5 mm, or less than or equal to 0.2 mm. Combinations of the above-referenced ranges are also possible (e.g., greater than or equal to 0.1 mm and less than or equal to 100 mm, or greater than or equal to 2 mm and less than or equal to 10 mm). Other ranges are also possible.

In some embodiments, a filament and/or plurality of filaments may be prepared for use prior to be positioned at least partially in a reaction volume. Preparing the filaments for use prior to actual use may reduce the system downtime that would otherwise accrue as the filaments are prepared. One example of a manner in which a filament and/or plurality of filaments may be prepared for use is that, if such filament(s) take the form of wire(s), they may be pre-strung on a filament support (e.g., a racking system as described elsewhere herein) prior to being introduced into the reaction volume. The pre-strung filament support may then be introduced into the reaction volume in one piece, instead of introducing and stringing each filament separately. Additionally, when an operator wishes to remove the filaments from the system (e.g., to be replaced with other filaments), it may be possible for the operator to do so by removing the filament support instead of removing each filament individually. This may further reduce equipment downtime.

When a system comprises a plurality of filaments taking the form of wires, the wires may be positioned at advantageous distances from their nearest neighbors. In some embodiments, an average distance between each wire and its nearest neighbor may be greater than or equal to 0.1 inch, greater than or equal to 0.25 inches, greater than or equal to 0.5 inches, greater than or equal to 0.75 inches, greater than or equal to 1 inch, greater than or equal to 1.25 inches, greater than or equal to 1.5 inches, greater than or equal to 1.75 inches, greater than or equal to 2 inches, or greater than or equal to 2.25 inches. In some embodiments, an average distance between each wire and its nearest neighbor may be less than or equal to 2.5 inches, less than or equal to 2.25 inches, less than or equal to 2 inches, less than or equal to 1.75 inches, less than or equal to 1.5 inches, less than or equal to 1.25 inches, less than or equal to 1 inch, less than or equal to 0.75 inches, less than or equal to 0.5 inches, or less than or equal to 0.25 inches. Combinations of the above-referenced ranges are also possible (e.g., greater than or equal to 0.1 inch and less than or equal to 2.5 inches). Other ranges are also possible.

In some embodiments, each wire in a plurality of wires may be positioned at a distance from its nearest neighbor that is substantially the same (e.g., the standard deviation of the distance between each wire and its nearest neighbor may be less than or equal to 10%, less than or equal to 5%, less than or equal to 2%, or less than or equal to 1% of the average distance between the each filament and its nearest neighbor). In some embodiments, different wires in the plurality of wires may be positioned at substantially different distances from their nearest neighbors.

When a system comprises a plurality of filaments taking the form of wires at least partially in a reaction volume, the wires may be positioned at advantageous distances from the base that (together with a plurality of walls) encloses the reaction volume. The average distance between the wires and the base may be greater than or equal to 0.1 inch, greater than or equal to 0.2 inches, greater than or equal to 0.25 inches, greater than or equal to 0.3 inches, greater than or equal to 0.4 inches, greater than or equal to 0.5 inches, greater than or equal to 0.75 inches, greater than or equal to 1 inch, greater than or equal to 1.5 inches, greater than or equal to 2 inches, greater than or equal to 3 inches, greater than or equal to 4 inches, greater than or equal to 5 inches, greater than or equal to 7.5 inches, greater than or equal to 10 inches, greater than or equal to 12.5 inches, greater than or equal to 15 inches, greater than or equal to 17.5 inches, or greater than or equal to 20 inches. The average distance between the wires and the base may be less than or equal to 24 inches, less than or equal to 20 inches, less than or equal to 17.5 inches, less than or equal to 15 inches, less than or equal to 12.5 inches, less than or equal to 10 inches, less than or equal to 7.5 inches, less than or equal to 5 inches, less than or equal to 4 inches, less than or equal to 3 inches, less than or equal to 2 inches, less than or equal to 1.5 inches, less than or equal to 1 inch, less than or equal to 0.75 inches, less than or equal to 0.5 inches, less than or equal to 0.4 inches, less than or equal to 0.3 inches, less than or equal to 0.25 inches, or less than or equal to 0.2 inches. Combinations of the above-referenced ranges are also possible (e.g., greater than or equal to 0.1 inch and less than or equal to 24 inches, or greater than or equal to 0.25 inches and less than or equal to 5 inches). Other ranges are also possible.

In some embodiments, each wire in a plurality of wires is positioned at a distance from the base that is substantially the same (e.g., the standard deviation of the distance between each wire and the base may be less than or equal to 10%, less than or equal to 5%, less than or equal to 2%, or less than or equal to 1% of the average distance between the each filament and the base). In some embodiments, different wires in the plurality of wires are positioned at substantially different distances from the base.

As described elsewhere herein, in some embodiments, the system is configured such that the distance between a wire (and/or plurality of wires) and a base may be changed. The change may comprise adjusting the distance from one of the values in the above-referenced ranges to a second, different value in one or more of the above-referenced ranges. This change may occur relatively rapidly. As one example, in some embodiments, the system may be configured such that the distance between the wire (and/or plurality of wires) and the base may be changed over a period of time of seconds or minutes.

In some embodiments, one or more processes may be performed on filaments. As an example, in some embodiments, and as described elsewhere herein, a voltage is applied across a filament (e.g., across a filament taking the form of a wire) to cause it to resistively heat. In some embodiments, the application of a voltage across a filament causes the filament to be heated to a temperature that is desirable. For instance, application of a voltage across a filament may cause the filament to be heated to a temperature of greater than or equal to 150° C., greater than or equal to 200° C., greater than or equal to 250° C., greater than or equal to 300° C., greater than or equal to 350° C., greater than or equal to 400° C., greater than or equal to 450° C., greater than or equal to 500° C., greater than or equal to 550° C., greater than or equal to 600° C., greater than or equal to 650° C., greater than or equal to 700° C., greater than or equal to 750° C., greater than or equal to 800° C., greater than or equal to 850° C., greater than or equal to 900° C., greater than or equal to 950° C., greater than or equal to 1000° C., greater than or equal to 1100° C., greater than or equal to 1200° C., greater than or equal to 1300° C., or greater than or equal to 1400° C. In some embodiments, application of a voltage across a filament causes the filament to be heated to a temperature of less than or equal to 1500° C., less than or equal to 1400° C., less than or equal to 1300° C., less than or equal to 1200° C., less than or equal to 1100° C., less than or equal to 1000° C., less than or equal to 950° C., less than or equal to 900° C., less than or equal to 850° C., less than or equal to 800° C., less than or equal to 750° C., less than or equal to 700° C., less than or equal to 650° C., less than or equal to 600° C., less than or equal to 550° C., less than or equal to 500° C., less than or equal to 450° C., less than or equal to 400° C., less than or equal to 350° C., less than or equal to 300° C., less than or equal to 250° C., or less than or equal to 200° C. Combinations of the above-referenced ranges are also possible (e.g., greater than or equal to 150° C. and less than or equal to 1500° C., or greater than or equal to 150° C. and less than or equal to 1000° C.). Other ranges are also possible. The temperature of the filament may be determined by use of a thermocouple.

It is also possible for the voltage applied across a filament and/or for the temperature of a filament to be maintained within a certain range. This range may be a range that enhances the rate of one or more desirable reactions and/or reduces the rate of one or more undesirable reactions. For instance, in the case of a polymerization reaction, the temperature range may be a range that promotes polymerization of the desired monomers at appreciable rates, promotes the decomposition of precursor(s) to form initiator(s) at appreciable rates, and/or promotes the decomposition of precursor(s) to form the desired monomer(s) at appreciable rates but which does not promote undesirable side reactions to a significant extent. The temperature range of the filament may, in some embodiments, be maintained within a particular range by an automated process. The automated process may comprise sensing the temperature of the filament (and/or sensing a property of the filament and/or reaction volume that is a proxy for the temperature of the filament). It may also comprise adjusting one or more inputs to the filament (and/or one or more properties of the reaction volume) if the temperature of the filament (and/or its proxy) exceeds or falls below a certain range. If the temperature of the filament (and/or its proxy) falls within the range, the input(s) to the filament (and/or properties of the reaction volume) may be maintained.

As one specific example, in some embodiments, a temperature of a filament is maintained within a certain range by sensing and adjusting the current passing through a resistively-heated filament. The energy dissipated by the filament may have a known relationship to the current passing through the filament and the voltage applied across the filament. For instance, the energy dissipated by the filament may be calculated by solving the following equation: Energy=(Current)*(Voltage). The temperature of the filament may be determined by solving the following equation: Resistivity of Filament=(Resistivity at Reference Temperature)+(Known Variation of Resistivity with Temperature)*(Difference Between Reference Temperature and Filament Temperature).

More specifically, in some embodiments, the temperature of a filament is maintained within a certain temperature range by passing a current through the filament, sensing the resistance of the filament, and adjusting the voltage applied across the filament if its measured resistance differs by more than a certain percentage from a set point. The resistance of the filament may be sensed directly, or may be sensed indirectly (e.g., by sensing a proxy for the resistance and then determining the resistance from this proxy). One example of a method of indirectly sensing the resistance of the filament comprises sensing the current passing through the filament and then applying Ohm's law to determine the resistance of the filament. The current passing through the filament may be determined by, for instance, use of an ammeter. The voltage may be adjusted to bring the current back to being within a range that is indicative of the filament being within a certain temperature range. For instance, the voltage may be increased if a low level of current is sensed flowing through the filament or the voltage may be decreased if a high level of current is sensed flowing through the filament.

Adjustments to one or more filament properties may be made by a proportional-integral-derivative controller. The proportional-integral derivative controller may take as inputs any suitable properties that are sensed and/or whose values may trigger an adjustment to the applied voltage. For instance, if the current passing through the filament is sensed and/or the applied voltage is adjusted based on the current passing through the filament, the proportional-integral-derivative controller may adjust the voltage based on the sensed current. As another example, if the resistance of the filament is sensed and/or the applied voltage is adjusted based on the resistance of the filament, the proportional-integral-derivative controller may adjust the voltage based on the resistance of the filament (and, thus, on the voltage applied to the filament and the current passing through the filament if Ohm's law is employed to calculate this resistance). As a third example, if the power dissipated by the filament is sensed and/or the applied voltage is adjusted based on the power dissipated by the filament, the proportional-integral-derivative controller may adjust the voltage based on the power dissipated by the filament (and, thus, on the voltage applied to the filament and the current passing through the filament if the equation for energy dissipation supplied above is employed to calculate this resistance).

An adjustment to the voltage applied across the filament may be made when the resistance of the filament differs from the set point by greater than or equal to 0.1% of the set point, greater than or equal to 0.2% of the set point, greater than or equal to 0.5% of the set point, greater than or equal to 0.75% of the set point, greater than or equal to 1% of the set point, greater than or equal to 1.5% of the set point, greater than or equal to 2% of the set point, greater than or equal to 2.5% of the set point, greater than or equal to 3% of the set point, or greater than or equal to 4% of the set point. An adjustment to the voltage applied across the filament may be made when the resistance of the filament differs from the set point by less than or equal to 5% of the set point, less than or equal to 4% of the set point, less than or equal to 3% of the set point, less than or equal to 2.5% of the set point, less than or equal to 2% of the set point, less than or equal to 1.5% of the set point, less than or equal to 1% of the set point, less than or equal to 0.75% of the set point, less than or equal to 0.5% of the set point, or less than or equal to 0.2% of the set point. Combinations of the above-referenced ranges are also possible (e.g., greater than or equal to 0.1% of the set point and less than or equal to 5% of the set point, or greater than or equal to 0.1% of the set point and less than or equal to 1.5% of the set point). Other ranges are also possible.

It should be understood that the ranges in the preceding paragraph may independently refer to values in excess of the set point or values below the set point. As an example, the reference to the adjustment of the voltage applied across a filament at a variation of greater than or equal to 1% of the set point above may independently refer to the adjustment of the voltage applied across a filament when the resistance of the filament is greater than or equal to 101% of the set point and the adjustment of the voltage applied across a filament when the resistance of the filament is less than or equal to 99% of the set point. It is possible for the adjustment of the voltage applied across a filament to be triggered at positive and negative deviations of the resistance from the set point having the same absolute value (e.g., an adjustment of the voltage applied across a filament may be triggered when the resistance of the filament exceeds the set point by greater than or equal to 1% of the set point or is reduced from the set point by greater than or equal to 1% of the set point) or may be triggered at positive and negative deviations of the resistance from the set point having different values (e.g., an adjustment of the voltage applied across a filament may be triggered when the resistance of the filament exceeds the set point by greater than or equal to 0.5% of the set point or is reduced from the set point by greater than or equal to 1% of the set point).

It is also possible for a system to comprise a safety feature that shuts off filament heating and/or the application of a voltage across a filament. One example of a safety feature is a feature that prevents filament heating and/or the application of a voltage across the filament when the reaction volume is open, advantageously preventing operators from touching a live filament. It is also possible for a safety feature to be a feature that prevents runaway heating of the filament and/or the application of a voltage across a filament that is broken and/or substantially weakened. For instance, in some embodiments, an automated process for sensing the temperature of a filament (and/or sensing a property of the filament and/or reaction volume that is a proxy for the temperature of the filament) may be performed as described in the preceding paragraphs. If the temperature of the filament and/or proxy for the temperature of the filament is outside of a certain range (e.g., a range larger than the range at which an adjustment to an input to the filament and/or a property of the reaction may be performed), a warning may be provided and/or the filament may be turned off (e.g., by removing the voltage applied thereacross). It is also possible for a warning to be provided and/or for the filament to be turned off if a particular set of adjustments to the input(s) to the filament (and/or properties of the reaction volume) does not, after an appropriate period of time, result in a change in the filament temperature and/or the proxy for the filament temperature in a manner indicative of a return of the filament temperature to the desired range.

As another example, in some embodiments, an automated process for sensing the resistance of a filament (and/or sensing a property of the filament and/or reaction volume that is a proxy for the resistance of the filament) may be performed as described in the preceding paragraphs. If the resistance of the filament and/or proxy for the resistance of the filament is outside of a certain range (e.g., a range larger than the range at which an adjustment to an input to the filament and/or a property of the reaction may be performed), a warning may be provided and/or the filament may be turned off (e.g., by removing the voltage applied thereacross). It is also possible for a warning to be provided and/or for the filament to be turned off if a particular set of adjustments to the input(s) to the filament (and/or properties of the reaction volume) does not, after an appropriate period of time, result in a change in the filament resistance and/or the proxy for the filament temperature in a manner indicative of a return of the filament resistance to the desired range.

In some embodiments, the current passing through a filament may be a proxy for the temperature and/or the resistance of the filament. As described above, the current passing through a filament may also be employed to determine the temperature of the filament. Additionally, and without wishing to be bound by any particular theory, it is believed that the current passing through a filament upon the application of a known voltage may be indicative of the resistance of the filament. For instance, by applying Ohm's law, the resistance of a filament may be found to be equal to the ratio of the applied voltage to the current passing through this filament. Accordingly, large changes in the resistance of a filament, rapid changes in the resistance of a filament, and/or changes in the resistance of a filament that do not respond to a change in the voltage applied across the filament may be indicative of a filament that has undergone a physical and/or chemical process causing it to have a different resistivity. If the filament's resistivity becomes very high, the filament may undesirably dissipate large amounts of heat to the reaction volume, melt, and/or undergo catastrophic failure (the latter of which may be sensed as the filament exhibiting infinite resistance). For these reasons, the presence of a system that warns an operator that the filament may have undergone such a process and/or shuts off the filament may promote the safe operation of the system.

A warning may be provided and/or a filament may be shut off when the resistance of the filament differs from the set point by greater than or equal to 0.1% of the set point, greater than or equal to 0.2% of the set point, greater than or equal to 0.5% of the set point, greater than or equal to 0.75% of the set point, greater than or equal to 1% of the set point, greater than or equal to 1.5% of the set point, greater than or equal to 2% of the set point, greater than or equal to 2.5% of the set point, greater than or equal to 3% of the set point, or greater than or equal to 4% of the set point. A warning may be provided and/or a filament may be shut off when the resistance of the filament differs from the set point by less than or equal to 5% of the set point, less than or equal to 4% of the set point, less than or equal to 3% of the set point, less than or equal to 2.5% of the set point, less than or equal to 2% of the set point, less than or equal to 1.5% of the set point, less than or equal to 1% of the set point, less than or equal to 0.75% of the set point, less than or equal to 0.5% of the set point, or less than or equal to 0.2% of the set point. Combinations of the above-referenced ranges are also possible (e.g., greater than or equal to 0.1% of the set point and less than or equal to 5% of the set point, or greater than or equal to 0.1% of the set point and less than or equal to 1.5% of the set point). Other ranges are also possible.

It should be understood that the ranges in the preceding paragraph may independently refer to values in excess of the set point or values below the set point. As an example, the reference to the issuance of a warning at a variation of greater than or equal to 1% of the set point above may independently refer to the issuance of a warning when the resistance of the filament is greater than or equal to 101% of the set point and the issuance of a warning when the resistance of the filament is less than or equal to 99% of the set point. It is possible for a warning to be triggered at positive and negative deviations of the resistance from the set point having the same absolute value (e.g., a warning may be triggered when the resistance of the filament exceeds the set point by greater than or equal to 1% of the set point or is reduced from the set point by greater than or equal to 1% of the set point) or may be triggered at positive and negative deviations of the resistance from the set point having different values (e.g., a warning may be triggered when the resistance of the filament exceeds the set point by greater than or equal to 0.5% of the set point or is reduced from the set point by greater than or equal to 1% of the set point).

It is also possible for a property of the filament other than its resistance to be sensed and/or for an action to be taken by the system (e.g., an increase or decrease in the voltage applied across the filament, a shutoff of the filament, the issuance of a warning) in response to a change in the value of a property other than resistance and/or upon the sensing of a property other than resistance outside of a range around a set point. As one example, filament temperature (e.g., as determined by use of a pyrometer) may be sensed and/or one or more actions may be taken by the system based, at least in part, on the sensed temperature. As another example, the power dissipated by the filament may be sensed and/or one or more actions may be taken by the system based, at least in part, on the power dissipated as sensed.

Another example of a process that may be performed on a filament to increase its performance is the application of a force to the filament. For instance, in some embodiments, a tensile force is applied to a filament taking the form of a wire. Without wishing to be bound by any particular theory, the application of the tensile force to the wire may cause the wire to become taut, which may prevent it from sagging and/or may maintain the wire (e.g., stably) in a desirable position within the reaction volume. As sagging of the wire may undesirably cause the wire to break and/or form a short circuit upon contact with another component positioned in the reaction volume, keeping the wire taut may advantageously enhance system performance. The amount of force that is applied may be selected based on one or more mechanical properties of the wire. As an example, the force may be selected such that it is sufficient to pull the wire taut but not insufficient to break and/or cause appreciable elastic deformation of the wire.

In some embodiments, a ratio of the tensile force applied to the wire to the rated tensile strength of the material forming the wire is greater than or equal to 0.1, greater than or equal to 0.15, greater than or equal to 0.2, greater than or equal to 0.25, greater than or equal to 0.3, greater than or equal to 0.35, greater than or equal to 0.4, greater than or equal to 0.45, greater than or equal to 0.5, greater than or equal to 0.55, greater than or equal to 0.6, greater than or equal to 0.65, greater than or equal to 0.7, greater than or equal to 0.75, greater than or equal to 0.8, greater than or equal to 0.85, or greater than or equal to 0.9. In some embodiments, a ratio of the tensile force applied to the wire to the rated tensile strength of the material forming the wire is less than or equal to 0.95, less than or equal to 0.9, less than or equal to 0.85, less than or equal to 0.8, less than or equal to 0.75, less than or equal to 0.7, less than or equal to 0.65, less than or equal to 0.6, less than or equal to 0.55, less than or equal to 0.5, less than or equal to 0.45, less than or equal to 0.4, less than or equal to 0.35, less than or equal to 0.3, less than or equal to 0.25, less than or equal to 0.2, or less than or equal to 0.15. Combinations of the above-referenced ranges are also possible (e.g., greater than or equal to 0.1 and less than or equal to 0.95, or greater than or equal to 0.6 and less than or equal to 0.8). Other ranges are also possible.

The values in the preceding paragraph may refer to the rated strength of the material forming the wire at a variety of suitable temperatures. In some embodiments, the ratio of the tensile force applied to a wire to its rated tensile strength is in one or more of the ranges described above when the temperature of the wire is a temperature to which the filament is heated during deposition of a fluorinated polymeric coating (e.g., a temperature in one or more such ranges provided elsewhere herein). Similarly, the amounts of tensile force may be applied to the wire when the wire is positioned in a variety of suitable environments. As an example, in some embodiments, the tensile force may be applied to the wire during the deposition of a fluorinated polymeric coating on a substrate. In such embodiments, the temperature and/or pressure of the environment in which the wire is positioned may be in one or more of the ranges described for such deposition reactions elsewhere herein.

As described elsewhere herein, in some embodiments, energy may be provided to a reaction volume by a plasma. This energy may catalyze one or more reactions (e.g., a polymerization reaction, a decomposition reaction in which a precursor to a monomer decomposes to form a monomer, a decomposition reaction in which a precursor to an initiator decomposes to form an initiator) occurring in the reaction volume. The plasma may be a phase of matter which comprises particles which are charged and/or which comprise a free radical.

In some embodiments, plasma is provided in the form of a wave, such as a radio frequency wave. The plasma may be provided at a frequency of greater than or equal to 3 MHz, greater than or equal to 5 MHz, greater than or equal to 7.5 MHz, greater than or equal to 10 MHz, greater than or equal to 12.5 MHz, greater than or equal to 15 MHz, greater than or equal to 17.5 MHz, greater than or equal to 20 MHz, greater than or equal to 25 MHz, greater than or equal to 30 MHz, greater than or equal to 35 MHz, or greater than or equal to 40 MHz. In some embodiments, the plasma is provided at a frequency of less than or equal to 50 MHz, less than or equal to 35 MHz, less than or equal to 30 MHz, less than or equal to 25 MHz, less than or equal to 20 MHz, less than or equal to 17.5 MHz, less than or equal to 15 MHz, less than or equal to 12.5 MHz, less than or equal to 10 MHz, less than or equal to 7.5 MHz, or less than or equal to 5 MHz. Combinations of the above-referenced ranges are also possible (e.g., greater than or equal to 7.5 MHz and less than or equal to 20 MHz, greater than or equal to 10 MHz and less than or equal to 15 MHz, or greater than or equal to 10 MHz and less than or equal to 20 MHz). Other ranges are also possible.

In some embodiments, the plasma is supplied in the form of one or more pulses. Pulses may occur at any frequency. In some embodiments, the plasma is supplied in the form of pulses with a frequency of greater than or equal to 0.25 kHz, greater than or equal to 0.5 kHz, greater than or equal to 0.75 kHz, greater than or equal to 1 kHz, greater than or equal to 1.5 kHz, greater than or equal to 2 kHz, greater than or equal to 3 kHz, greater than or equal to 5 kHz, greater than or equal to 7.5 kHz, greater than or equal to 10 kHz, greater than or equal to 15 kHz, greater than or equal to 25 kHz, greater than or equal to 50 kHz, or greater than or equal to 75 kHz. In some embodiments, the plasma is supplied in the form of pulses with a frequency of less than or equal to 100 kHz, less than or equal to 75 kHz, less than or equal to 50 kHz, less than or equal to 25 kHz, less than or equal to 15 kHz, less than or equal to 10 kHz, less than or equal to 7.5 kHz, less than or equal to 5 kHz, less than or equal to 3 kHz, less than or equal to 2 kHz, less than or equal to 1.5 kHz, less than or equal to 1 kHz, less than or equal to 0.75 kHz, or less than or equal to 0.5 kHz. Combinations of the above-referenced ranges are also possible (e.g., greater than or equal to 0.5 kHz and less than or equal to 10 kHz, greater than or equal to 1 kHz and less than or equal to 15 kHz, or greater than or equal to 1 kHz and less than or equal to 10 kHz). Other ranges are also possible.

In some embodiments, the plasma is supplied in the form of pulses which comprise a duty cycle. They duty cycle is equivalent to the amount of time for which the plasma is applied divided by the total cycle time (the sum of the time for which the plasma is applied and the time for which the plasma is not applied). Any suitable duty cycle may be employed. In some embodiments, the plasma is supplied in the form of pulses which comprise a duty cycle of greater than or equal to 0.02, greater than or equal to 0.05, greater than or equal to 0.1, greater than or equal to 0.2, greater than or equal to 0.3, greater than or equal to 0.4, or greater than or equal to 0.5. In some embodiments, the plasma is supplied in the form of pulses which comprise a duty cycle of less than or equal to 0.75, less than or equal to 0.5, less than or equal to 0.4, less than or equal to 0.3, less than or equal to 0.2, less than or equal to 0.1, or less than or equal to 0.05. Combinations of the above-referenced ranges are also possible (e.g., greater than or equal to 0.05 and less than or equal to 0.2). Other ranges are also possible. In some embodiments, the plasma is supplied to the reaction volume at a constant intensity.

In some embodiments, the plasma is supplied in the form of a remote plasma. A remote plasma may be supplied at any distance from the substrate. In some embodiments, the plasma is supplied at a distance from the substrate of greater than or equal to 1 cm, greater than or equal to 3 cm, greater than or equal to 5 cm, greater than or equal to 8 cm, greater than or equal to 10 cm, greater than or equal to 15 cm, greater than or equal to 20 cm, greater than or equal to 25 cm, or greater than or equal to 30 cm. In some embodiments, the plasma is supplied at a distance from the substrate of less than or equal to 50 cm, less than or equal to 30 cm, less than or equal to 25 cm, less than or equal to 20 cm, less than or equal to 15 cm, less than or equal to 10 cm, less than or equal to 8 cm, less than or equal to 5 cm, or less than or equal to 3 cm. Combinations of the above-referenced ranges are also possible (e.g., greater than or equal to 1 cm and less than or equal to 30 cm, greater than or equal to 3 cm and less than or equal to 25 cm, or greater than or equal to 8 cm and less than or equal to 50 cm). Other ranges are also possible.

The plasma may be provided at any suitable power density. The power density of a plasma is equivalent to the energy provided by the plasma per square centimeter plasma electrode. In some embodiments, the plasma is present at a power density of greater than or equal to 0.5 mW/cm$^2$, greater than or equal to 0.75 mW/cm$^2$, greater than or equal to 0.1 mW/cm$^2$, greater than or equal to 1.5 mW/cm$^2$, greater than or equal to 2 mW/cm$^2$, greater than or equal to 5 mW/cm$^2$, greater than or equal to 7.5 mW/cm$^2$, greater than or equal to 10 mW/cm$^2$, greater than or equal to 12.5 mW/cm$^2$, greater than or equal to 15 mW/cm$^2$, greater than or equal to 20 mW/cm$^2$, greater than or equal to 30 mW/cm$^2$, greater than or equal to 35 mW/cm$^2$, greater than or equal to 40 mW/cm$^2$, or greater than or equal to 45 mW/cm$^2$. In some embodiments, the plasma is present at a power density of less than or equal to 50 mW/cm$^2$, less than or equal to 45 mW/cm$^2$, less than or equal to 40 mW/cm$^2$, less than or equal to 35 mW/cm$^2$, less than or equal to 30 mW/cm$^2$, less than or equal to 25 mW/cm$^2$, less than or equal to 20 mW/cm$^2$, less than or equal to 15 mW/cm$^2$, less than or equal to 12.5 mW/cm$^2$, less than or equal to 10 mW/cm$^2$, less than or equal to 7.5 mW/cm$^2$, less than or equal to 5 mW/cm$^2$, less than or equal to 2 mW/cm$^2$, less than or equal to 1.5 mW/cm$^2$, less than or equal to 1 mW/cm$^2$, or less than or equal to 0.75 mW/cm$^2$. Combinations of the above-referenced ranges are also possible (e.g., greater than or equal to 0.5 mW/cm$^2$ and less than or equal to 1 mW/cm$^2$, greater than or equal to 0.5 mW/cm$^2$ and less than or equal to 2 mW/cm$^2$, greater than or equal to 0.75 mW/cm$^2$ and less than or equal to 5 mW/cm$^2$, greater than or equal to 1 mW/cm$^2$ and less than or equal to 10 mW/cm$^2$, or greater than or equal to 0.5 mW/cm$^2$ and less than or equal to 15 mW/cm$^2$). Other ranges are also possible.

When present, the plasma may be substantially uniform throughout a reaction volume to which it is supplied. Plasma uniformity may be characterized by the ratio of the standard deviation of the power density over the reaction volume to the average power density over the reaction volume. In some embodiments, the ratio of the standard deviation of the power density over the reaction volume to the average power density over the reaction volume is less than or equal to 25%, less than or equal to 20%, less than or equal to 15%, less than or equal to 10%, or less than or equal to 5%. Other ranges are also possible.

In some embodiments, a high plasma uniformity is achieved by incorporating certain design elements into the reaction volume and/or deposition chamber. For example, a reaction volume and/or deposition chamber may comprise an electrode and coupling near the center of the electrode. As another example, a reaction volume and/or deposition chamber may comprise a shielded inlet power source. Other design features which may improve plasma uniformity in a reaction volume may also be incorporated.

As described elsewhere herein, in some embodiments, a system comprises one or more sources configured to introduce and/or remove one or more species from the reaction volume. The sources may be sources that are in fluidic communication with the reaction volume at all times, or may be sources that may be placed in and/or removed from fluidic communication with the reaction volume (e.g., reversibly). Further detail regarding specific types of sources are provided below.

The sources described herein may have a variety of suitable forms. In some embodiments, a source takes the form of a reservoir of a material (or of vacuum) that may be placed in and/or removed from fluidic communication with the reaction volume by a port. As one example, a source of gas may take the form of and/or comprise a gas cylinder (e.g., comprising the pressurized gas). The port may separate the reaction volume from source, and may be opened and/or closed to place the source in and/or out of fluidic communication with the reaction volume. The port may be in direct or indirect fluidic communication with the source. For instance, the port may be in fluidic communication with the source via tubing.

The interface between a port and the reaction volume may have a variety of suitable designs. In some embodiments, the port has a single opening through which, when the port is open, the source is placed in fluidic communication with the reaction volume. The single opening may have a variety of suitable shapes and sizes. For instance, it may be round, rectangular, square, etc. Some suitable ports have multiple openings. As one specific example, a port may comprise a plurality of openings. The plurality of openings may be positioned along a wall of the reaction volume and/or along a tube present in the reaction volume.

In some embodiments, a system comprising two sources comprises ports in fluidic communication with the sources that are positioned opposite to each other across the reaction volume. However, it is also possible for a system to, additionally or alternatively, comprise such ports that are not positioned opposite to each other. Such ports may be positioned on opposing sides of a reaction volume but staggered such that they are not directly opposite each other or may be positioned on adjacent sides of a reaction volume.

In some embodiments, in addition to or instead of a port, a flow controller may be positioned between a source and a reaction volume. As one example, in some embodiments, a mass flow controller is placed between a source of gas and the reaction volume. As another example, and as described elsewhere herein, a throttling valve may be placed between a source of vacuum and a reaction volume.

As also described elsewhere herein, in some embodiments, a source and/or plurality of sources is capable of and/or configured to introduce a gas and/or combination of gases that may react to deposit a fluorinated polymeric coating on a substrate. The gas and/or combination of gases may comprise a process gas. The process gas may comprise one or more gaseous monomers (e.g., one or more gaseous monomers that may undergo a polymerization reaction to form a fluorinated polymer, such as one or more fluorinated monomers). In some embodiments, the process gas comprises one or more species that are not themselves monomers, but which may form monomers in the reaction volume (in other words, species that are precursors to monomers). For instance, in some embodiments, a process gas comprises one or more species that are configured to undergo a chemical reaction to form a monomer inside the reaction volume, such as a decomposition and/or pyrolization reaction. This chemical reaction may be catalyzed by one or more conditions and/or species present in the reaction volume. For instance, the chemical reaction may be catalyzed by heat, such as by exposure to a heated filament. It is also possible for a process gas to comprise an initiator and/or a carrier gas (e.g., an inert gas, such as nitrogen, helium, and/or argon).

Non-limiting examples of suitable monomers and/or monomeric precursors (i.e., species that may undergo a reaction to form a monomer) include $C_3F_6O$ (HFPO or hexafluoropropylene oxide, which may be a species that decomposes to form a monomer, such as upon the application of heat thereto from a filament), $C_2F_4$, $C_3F_8$, $CF_3H$, $CF_2H_2$, $CF_2N_2$ (difluordiaxirine), $CF_3COCF_3$, $CF_2ClCOCF_2Cl$, $CF_2ClCOCFCl_2$, $CF_3COOH$, difluorohalomethanes (e.g., $CF_2Br$, $CF_2HBr$, $CF_2HCl$, $CF_2Cl_2$ and $CF_2FCl$), difluorocyclopropanes (e.g., $C_3F_6$, $C_3F_4H_2$, $C_3F_2Cl_4$, $C_2F_3Cl_3$ and $C_3F_4Cl_2$), trifluoromethylfluorophosphanes (e.g., $(CF_3)_3PF_3$, $(CF_3)_3PF_3$, and $(CF_3)PF_4$), and trifluoromethylphosphino compounds (e.g., $(CF_3)_3P$, $(CF_3)_2P$—$P(CF_3)_2$, $(CF_3)_2PX$ and $CF_3PX_2$, wherein X is F, Cl or H). It is also possible for two or more of the above-described gases to be provided in combination with each other (e.g., by a single source, by two or more sources).

In some embodiments, a process gas further comprises one or more carrier gases and/or one or more carrier gases are provided by a source. The carrier gas(es) may serve to dissolve and/or assist with the transportation of the monomers. Non-limiting examples of suitable carrier gases include inert gases (e.g., nitrogen, helium, argon).

As described elsewhere herein, it is also possible for a system to comprise a source of vacuum. The source of vacuum may be configured to evacuate the reaction volume when in fluidic communication therewith. This may be advantageous when, for instance, the reaction volume initially comprises a combination of gases that it would be undesirable for the reaction volume to include during the deposition of a fluorinated polymeric coating. For instance, and without wishing to be bound by any particular theory, it is believed that some gases may inhibit polymerization reactions. Such gases may react with the growing polymeric chains before they reach an appreciable length in a manner that terminates further growth and/or may react with monomers prior to being incorporated into growing polymeric chains in a manner that renders them non-reactive. Non-limiting examples of such gases include air, water vapor, acetone, and isopropanol.

Another example of a situation in which it may be desirable to remove one or more gases from a reaction volume is at the conclusion of a step performed during the deposition of a coating. During deposition of the coating, the reaction volume may comprise a variety of reactive and/or toxic gases. It may be desirable for the reaction volume to be purged of such gases before one or more further processes are performed. For instance, if the system is employed to perform a method comprising sequentially depositing two layers with two distinct chemical compositions, it may be desirable to remove the gases that reacted to form the first layer prior to beginning deposition of the second layer. Removal of these species may facilitate the deposition of a second layer that has the desired chemical composition, as it may prevent the incorporation of reaction products of these gases into the second layer and/or deleterious reactions between these gases and the gases configured to react to form the second layer.

A third example of a situation in which it may be desirable to remove one or more gases from a reaction volume is at the conclusion of a process for depositing a coating. As described above, the reaction volume may comprise reactive and/or toxic gases during coating deposition. It may be undesirable for an operator to be exposed to such gases and/or for such gases to be released in an uncontrolled manner to an environment external to the reaction volume. Accordingly, in such cases, it may be desirable for the gases present in the reaction volume to be removed therefrom prior to exposure of the reaction volume to an environment external thereto to retrieve a coated substrate at the conclusion of a coating process.

A variety of suitable types of sources of vacuum may be employed. As an example, in some embodiments, a source of vacuum comprises a vacuum pump. The vacuum pump, when turned on and in fluidic communication with the reaction volume, may evacuate the reaction volume by pumping out its contents.

In some embodiments, a source of vacuum has one or more properties that render it advantageous for removing air and/or other gases from a reaction volume. As one example, in some embodiments, a source of vacuum is configured such that the removal of gas from the reaction volume occurs over a period of time that is relatively slow. Without wishing to be bound by any particular theory, it is believed that relatively slow removal of gas from a reaction volume may be desirable when small and/or lightweight parts are positioned inside the reaction volume. Such parts are believed to have a tendency to be moved by currents of gas that may be generated when gas rapidly flows out of the reaction volume upon exposure to a source of vacuum. It is believed that slower removal of gas from the reaction volume may reduce the magnitude and/or number of such currents.

The slow and/or controlled removal of gas from a reaction volume may be accomplished by the use of a throttling valve positioned between the source of vacuum and the reaction chamber. The throttling valve may restrict the exposure of the reaction volume to the source of vacuum and/or may slowly open to allow increasing exposure of the reaction volume to the source of vacuum over time. These processes may cause the source of vacuum to remove the gases therein at a slower rate than the source of vacuum would absent such a throttling valve.

In some embodiments, a system is configured such that one or more gases may be removed from a reaction volume in a manner other than placing a source of vacuum in fluidic communication with the reaction volume. As one example, in some embodiments, a system may be configured such that one or more gases may be introduced into the reaction volume that displace other gases present in the reaction volume therefrom. For instance, a system may be configured such that an inert gas (and/or a plurality of inert gases) may be introduced into a reaction volume to displace a reactive and/or toxic gas (and/or a plurality of reactive and/or toxic gases). The inert gas(es) may be introduced from one or more sources in fluidic communication with the reaction volume, such as one or more sources other than the source(s) supplying (and/or previously supplying) the reactive and/or toxic gas(es).

Introducing one or more inert gases into a reaction volume may be performed instead of removing gas(es) from the reaction volume by placing a source of vacuum in fluidic communication therewith, or in conjunction with such a process. In the latter case, the source of vacuum, when in fluidic communication with the reaction volume, may evacuate both the inert gas(es) and the reactive and/or toxic gas(es) from the reaction volume. In one specific example, the source of vacuum may be placed in fluidic communication with a reaction volume that comprises the reactive and/or toxic gases and that is in fluidic communication with one or more sources of inert gases. The source of vacuum may initially evacuate both types of gases. Then, the source(s) of inert gases may be removed from fluidic communication with the reaction volume while maintaining fluidic communication between the source of vacuum and the reaction volume. The source of vacuum may then further evacuate the reaction volume of any remaining gases therein.

In some embodiments, a system comprises an outlet that may be placed in fluidic communication with a reaction volume. The outlet may be configured to allow one or more gases present in the reaction volume to flow out of the reaction volume when in fluidic communication with the reaction volume. The outlet may be in fluidic communication with a location to which the gases present in the reaction volume may be safely exhausted, such as a fume hood. In some embodiments, the outlet may be in reversible fluidic communication with the reaction volume. For instance, the outlet may be removed from fluidic communication with the reaction volume during time periods in which the reaction volume is in fluidic communication with a source vacuum. It is also possible for the outlet to be configured such that gases may flow out of the reaction volume through the outlet but that gases are not able to flow into the reaction volume through the outlet. For instance, in some embodiments, the outlet may comprise a check valve, a gas bubbler, and/or another component that provides this functionality. In some embodiments, the outlet is configured to allow for gases to both flow into and flow out of the reaction volume, but the gases flowing into the reaction volume (e.g., from one or more sources) may be flowing into the reaction volume in sufficient amounts and/or at sufficient rates such that there is no appreciable flow into the reaction volume from the outlet.

In some embodiments, a system described herein comprises a cooling system. The cooling system may be configured to cool one or more portions of the reaction volume. For instance, as an example, in some embodiments, a system comprises a cooling system configured to cool a substrate being coated in the reaction volume. Advantageously, cooling the substrate may promote the formation of a coating thereon having a desired morphology, having a desired molecular weight, and/or that forms at a desired rate. By way of example, the temperature of the substrate may affect the tendency of gaseous species (e.g., gaseous polymers) to deposit on the substrate. For instance, if the substrate is cooler than one or more other portions of the reaction volume, the gaseous species may deposit preferentially on the substrate in comparison to other, warmer surfaces in the reaction volume. As another example, the temperature of the substrate may affect the mobility of any species deposited thereon. Without wishing to be bound by any particular theory, it is believed that heat enhances the mobility of species on a surface, and so cooler substrates may suppress the mobility of any species deposited thereon in comparison to warmer substrates. It is also believed that cooled substrates may exhibit reduced rates of polymerization thereon than in the comparatively warmer gaseous atmosphere in the reaction volume.

In some embodiments, a cooled substrate may facilitate the deposition of coatings onto substrates that would otherwise undergo one or more undesirable processes during the deposition process. For instance, in some embodiments, it may be desirable to deposit a coating onto a substrate that would otherwise melt and/or undergo a deleterious chemical reaction (e.g., a decomposition reaction, a reaction with one or more gases present in the reaction volume) during coating. Cooling the substrate may reduce and/or eliminate the tendency of the substrate to undergo such processes.

When present, cooling systems may have a variety of designs. In some embodiments, a cooling system comprises a cooling element. The cooling element may be a component of the cooling system that is configured to be held at a temperature cooler than one or more other components of the reaction volume. The cooling element may be configured to be maintained at a constant temperature (e.g., at a set point), within a constant temperature range (e.g., in a defined range around a set point), and/or within a variable temperature range (e.g., at any temperature below a certain value, at the coolest temperature at which it can be cooled to). The cooling element may be an article that is configured to cool a substrate. As an example, the cooling element may be configured to cool a substrate by being cooled itself. It may further directly contact one or more portions of the substrate, directly contact one or more components of the reaction volume positioned directly adjacent to one or more portions of the substrate (e.g., a thermally conductive layer positioned directly between the cooling element and one or more portions of the substrate), and/or be in close proximity to the substrate such that it cools a gas in close proximity to the substrate that then cools the substrate.

In some embodiments, a cooling element comprises one or more materials with a relatively high thermal conductivity. As an example, in some embodiments, a cooling element comprises a metal (e.g., aluminum).

A cooling element may, itself, be cooled by one or more further components of the cooling system. As an example, in some embodiments, a cooling system further comprises one or more components configured to cool the cooling element. One example of a suitable such component is a system configured to circulate a cooled fluid across and/or through the cooling element (e.g., across a surface of the cooling element other than a surface contacting the substrate, through the body of the cooling element). When the cooling element is configured such that a fluid may be circulated through and/or across the cooling element, the cooling element may be connected to a source and/or a drain for such fluid. In some embodiments, this connection and/or disconnection is reversible and/or may be performed relatively easily. This may advantageously facilitate easy introduction and/or removal of the cooling element. For instance, in some embodiments, a cooling element is connected to a source and/or drain for a fluid by quick-connects. Another example of a further component of a cooling system is a component configured to cool a coolant, such as a chiller. A third example is a component configured to cool the cooling element is a combination of electronic components that cools the cooling element by Peltier cooling.

Figure 8:
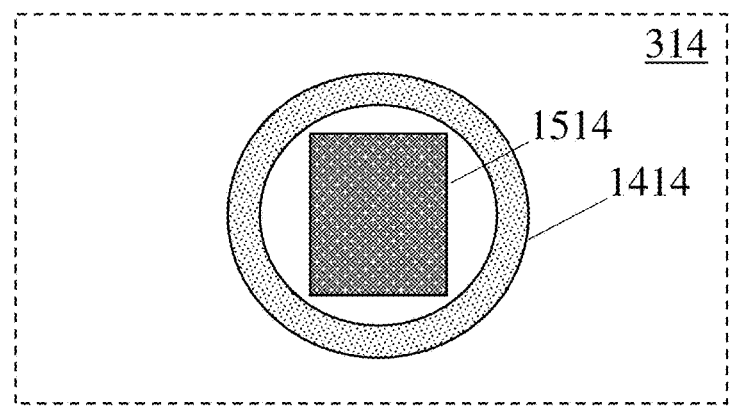
FIG. 8 shows a cooling element positioned around the substrate, in accordance with some embodiments.

In some embodiments, a cooling element is positioned in the reaction volume in a manner that promotes the cooling of the substrate in an advantageous manner. As one example, in some embodiments, a cooling element is positioned around the substrate. FIG. 8 shows one non-limiting embodiment of a top view of a cooling element having this property. In FIG. 8, the cooling element 1414 is positioned around the substrate 1514. The cooling element 1414 shown in FIG. 8 surrounds the substrate 1514 laterally on all sides.

Like the embodiment shown in FIG. 8, it is possible for a cooling element to be positioned around a substrate but have a different shape than the substrate and/or not contact the substrate. It is also possible for a cooling element to be positioned around a substrate but have substantially the same cross-sectional shape as the substrate and/or to contact the substrate in one or more locations (e.g., in one or more discrete locations, along the entirety of the external surface of the substrate, along the entirety of the external surface of the substrate that is positioned below a certain height). In some embodiments, a cooling element is positioned completely around the substrate (i.e., such that it surrounds the substrate laterally on all sides). It is also possible for a cooling element to be positioned partially around the substrate. Such cooling elements may be positioned proximate some, but not all, of the lateral sides of the substrate. For instance, a substrate may have a square cross-section and a cooling element may positioned proximate three of its four lateral sides.

Similarly, like the embodiment shown in FIG. 8, it is possible for a cooling element to be positioned around a substrate but not positioned beneath or above the substrate. It is also possible for a cooling element to be positioned both around the substrate and beneath the substrate and/or both around the substrate and above the substrate. In such cases, the cooling element may be positioned beneath and/or above all portions of the substrate. It is also possible for the cooling element to be positioned beneath and/or above one or more portions of the substrate but not beneath and/or above one or more other portion(s) of the substrate. The portion(s) of the cooling element positioned beneath and/or above the substrate may exclusively comprise portions that directly contact the substrate, may comprise one or more portions that directly contact the substrate and one or more portions that do not directly contact the substrate, and/or may lack any portions that directly contact the substrate.

In some embodiments, a cooling element and a substrate may be positioned such that one is freely movable with respect to the other. By way of example, in some embodiments, a cooling element and a substrate are positioned such that the substrate is freely-movable with respect to the cooling element. As another example, in some embodiments, a cooling element and a substrate are positioned such that the cooling element is freely-movable with respect to the substrate. In some such embodiments, the cooling element and/or the substrate are not in direct contact with each other. Regardless of whether or not the cooling element and the substrate comprise portions that are in direct contact with each other, the substrate may be freely moveable with respect to the cooling element if it can be moved in at least one direction for an appreciable distance (e.g., at least 0.1 inch, at least 0.25 inches, at least 0.5 inches, and/or at least 1 inch) while maintaining the cooling element in a constant position. The direction may be vertical, may be horizontal, may be in a direction towards one or more portions of the cooling element, and/or may be in a direction away from one or more portions of the cooling element. In some embodiments, the substrate may be capable of being moved with respect to the cooling element in all directions for an appreciable distance.

Similarly, the cooling element may be freely movable with respect to the substrate if it can be moved in at least one direction for an appreciable distance (e.g., at least 0.1 inch, at least 0.25 inches, at least 0.5 inches, and/or at least 1 inch) while maintaining the substrate in a constant position. Likewise, the direction may be vertical, may be horizontal, may be in a direction towards one or more portions of the substrate, and/or may be in a direction away from one or more portions of the substrate. In some embodiments, the cooling element may be capable of being moved with respect to the substrate in all directions for an appreciable distance.

In some embodiments, a cooling element has a design such that it has one or more dimensions having a desirable size. For instance, in some embodiments, a cooling element has a height such that the cooling element extends from the bottom of a substrate around which it is positioned to the top (or beyond the top) of the substrate around which it is positioned. Without wishing to be bound by any particular theory, it is believed that cooling elements having this property may advantageously be capable of cooling a substrate uniformly. Substrates that are relatively tall may, in the absence of a cooling element with such a design, experience a temperature gradient from upper, uncooled portions to lower, cooled portions. This temperature gradient may disadvantageously cause a fluorinated polymeric coating to deposit on the substrate in an uneven manner, as it is believed that the temperature of the substrate affects the physical properties of the coating formed thereon. It is also possible for tall substrates to be insufficiently cooled by cooling elements that do not extend sufficiently high on the substrate to fail to appropriately cool the upper portions of the substrate, which may cause the upper portions of the substrate to undergo the undesirable processes due to overheating described elsewhere herein.

Figure 9:
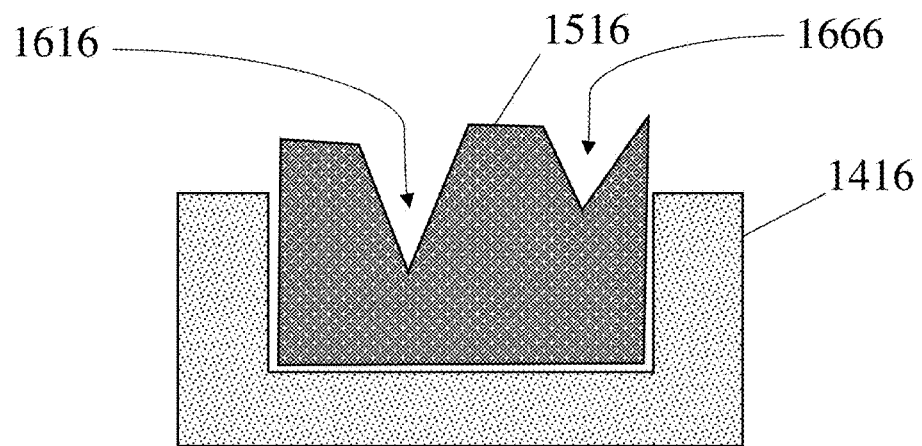
FIG. 9 shows a cooling element cooling element that has a height that is taller than the upper surface of the depressions in a substrate, in accordance with some embodiments.

In some embodiments, a cooling element does not extend to the full height of the substrate, but extends to a height that is taller than one or more features of the substrate. As one example, in some embodiments, a substrate comprises one or more depressions in its surface, and the cooling element may have a height that is taller than the upper surface of the depressions. FIG. 9 shows one example of a cooling element having this property. In FIG. 9, which depicts a cross-section of the cooling element and the substrate, the cooling element 1416 is positioned around and beneath the substrate 1516, which further comprises two depressions 1616 and 1666. As shown in FIG. 9, the cooling element 1416 extends to a height that is taller than the upper surface of the lower depression 1616 but does not extend to a height that is taller than the top of the substrate. The surfaces of depressions in a substrate are closer to the base of the substrate than the upper surfaces of the substrate. For this reason, it is believed that, if cooling is only provided from the base of the substrate, the surfaces of the depressions may be cooled to a lower temperature than the upper surfaces of the substrate, which, for the reasons described elsewhere herein, may cause the fluorinated polymeric coating to deposit onto the substrate in a non-uniform manner.

In some embodiments, a cooling element has a height of greater than or equal to 0.1 inch, greater than or equal to 0.15 inches, greater than or equal to 0.2 inches, greater than or equal to 0.25 inches, greater than or equal to 0.3 inches, greater than or equal to 0.4 inches, greater than or equal to 0.5 inches, greater than or equal to 0.75 inches, greater than or equal to 1 inch, greater than or equal to 1.5 inches, greater than or equal to 2 inches, greater than or equal to 3 inches, greater than or equal to 4 inches, greater than or equal to 5 inches, greater than or equal to 7.5 inches, greater than or equal to 10 inches, greater than or equal to 12.5 inches, greater than or equal to 15 inches, greater than or equal to 17.5 inches, or greater than or equal to 20 inches. In some embodiments, a cooling element has a height of less than or equal to 24 inches, less than or equal to 20 inches, less than or equal to 17.5 inches, less than or equal to 15 inches, less than or equal to 12.5 inches, less than or equal to 10 inches, less than or equal to 7.5 inches, less than or equal to 5 inches, less than or equal to 4 inches, less than or equal to 3 inches, less than or equal to 2 inches, less than or equal to 1.5 inches, less than or equal to 1 inch, less than or equal to 0.75 inches, less than or equal to 0.5 inches, less than or equal to 0.4 inches, less than or equal to 0.3 inches, less than or equal to 0.25 inches, less than or equal to 0.2 inches, or less than or equal to 0.15 inches. Combinations of the above-referenced ranges are also possible (e.g., greater than or equal to 0.1 inch and less than or equal to 24 inches, or greater than or equal to 0.5 inches and less than or equal to 5 inches). Other ranges are also possible.

When present, a cooling element may be configured to be maintained at and/or maintain a substrate at a variety of suitable temperatures. In some embodiments, a cooling element is configured to be maintained at and/or to maintain a substrate at a temperature of greater than or equal to 0° C., greater than or equal to 1° C., greater than or equal to 2° C., greater than or equal to 3° C., greater than or equal to 5° C., greater than or equal to 7.5° C., greater than or equal to 10° C., greater than or equal to 15° C., greater than or equal to 20° C., greater than or equal to 25° C., greater than or equal to 30° C., greater than or equal to 40° C., greater than or equal to 50° C., greater than or equal to 75° C., greater than or equal to 100° C., or greater than or equal to 125° C. In some embodiments, a cooling element is configured to be maintained at and/or to maintain a substrate at a temperature of less than or equal to 150° C., less than or equal to 125° C., less than or equal to 100° C., less than or equal to 75° C., less than or equal to 50° C., less than or equal to 40° C., less than or equal to 30° C., less than or equal to 25° C., less than or equal to 20° C., less than or equal to 15° C., less than or equal to 10° C., less than or equal to 7.5° C., less than or equal to 5° C., less than or equal to 3° C., less than or equal to 2° C., or less than or equal to 1° C. Combinations of the above-referenced ranges are also possible (e.g., greater than or equal to 0° C. and less than or equal to 150° C., greater than or equal to 0° C. and less than or equal to 100° C., or greater than or equal to 5° C. and less than or equal to 100° C.). Other ranges are also possible.

The ranges in the preceding paragraph may independently refer to the average temperature on an external surface of the cooling element (e.g., a surface closest to the substrate) and/or to the average temperature of an external surface of a substrate (e.g., a surface closest to the cooling element, a surface opposite the cooling element, an upper surface).

As described elsewhere herein, in some embodiments, a reaction volume comprises one or more gases. The reaction volume may comprise such gases in advantageous amounts and/or that have one or more other advantageous properties. Further information regarding such properties is provided below.

One example of an advantageous property that gases in a reaction volume may have is flowing through the reaction volume in a one-dimensional manner. One-dimensional flow may be flow in which the relevant gases flow primarily or entirely in one direction. It is also possible for one-dimensional flow to be laminar. As one example of one-dimensional flow, the one-dimensional flow of a gas may be flow in which the gas flows entirely in one direction and does not flow in any direction other than that direction. As another example, in some embodiments, one-dimensional flow of a gas comprises flow that is primarily, but not entirely in one direction. For instance, the one-dimensional flow may comprise small amounts of flow in directions other than the primary direction. These small amounts of flow may make up less than or equal to 50%, less than or equal to 20%, less than or equal to 10%, and/or less than or equal to 5% of the one-dimensional flow.

When two or more different types of gases are flowing through a reaction volume (e.g., two or more types of gases provided from a common source, two or more types of gases provided from different sources, provided from the same source), the different types of gases may together exhibit one-dimensional flow in a single direction. In other words, all of the gases together may flow entirely in the same direction and/or may together comprise amounts of flow in a direction other than the primary direction in one or more of the ranges described in the preceding paragraph. It is also possible for two or more different types of gases (e.g., provided from different sources, provided from the same source) to have flows that differ from each other. For instance, two or more different types of gases may each flow through the reaction volume in a one-dimensional manner, but the directions in which the different types of gases flow may differ from each other. As another example, in some embodiments, one or more types of gases may exhibit one-dimensional flow and one or more types of gases may not exhibit one-dimensional flow (e.g., one or more types of gases may exhibit convective and/or turbulent flow).

When one-dimensional flow is present in a reaction volume, the direction of the one-dimensional flow may generally be selected as desired. In some embodiments, the direction of the one-dimensional flow may be a direction that extends from a location at which a gas is introduced into the reaction volume to an outlet of the reaction volume. For instance, in some embodiments, the direction of one-dimensional flow is a direction that extends from a port in fluidic communication with a source of the relevant gas to an outlet. As another example, in some embodiments, the direction of one-dimensional flow is from one wall enclosing the reaction volume to another, opposite wall enclosing the reaction chamber. As a third example, in some embodiments, the direction of one dimensional-flow is parallel to the direction in which a filament and/or a plurality of filaments extends across the reaction volume (e.g., parallel to the longest dimension of a wire extending across the reaction volume). It is also possible for the direction of one-dimensional flow to be perpendicular to the direction in which a filament and/or a plurality of filaments extends across the reaction volume and/or to be at any angle in between parallel and perpendicular to the direction in which a filament and/or plurality of filaments extends across the reaction volume.

When a reaction volume comprises one-dimensional flow, the one-dimensional flow may be present in all of the reaction volume or may be present in some portions of the reaction volume but not others. The portion(s) of the reaction volume in which the one-dimensional flow is absent may lack flow (e.g., the gas in these portion(s) of the reaction volume may be stationary and/or substantially stationary) or may comprise flow that is not one-dimensional (e.g., flow in a different direction, flow in a plurality of different directions). In some embodiments, portion(s) of the reaction volume proximate a port in fluidic communication with a source of gases exhibit one-dimensional flow. As one example, in some embodiments, one or more such ports may be positioned proximate an upper portion of the reaction volume and the upper portion of the reaction volume may display one-dimensional flow.

In some embodiments, one-dimensional flow occurs across at least the top 25% of the reaction volume, at least the top 50% of the reaction volume, at least the top 67% of the reaction volume, at least the top 75% of the reaction volume, at least the top 80% of the reaction volume, and/or at least the top 90% of the reaction volume. In some embodiments, one-dimensional flow occurs across no more than the top 95% of the reaction volume, no more than the top 90% of the reaction volume, no more than the top 80% of the reaction volume, no more than the top 75% of the reaction volume, no more than the top 67% of the reaction volume, or no more than the top 50% of the reaction volume. Combinations of the above-referenced ranges are also possible (e.g., at least the top 25% and no more than the top 95% of the reaction volume). Other ranges are also possible.

Figure 10:
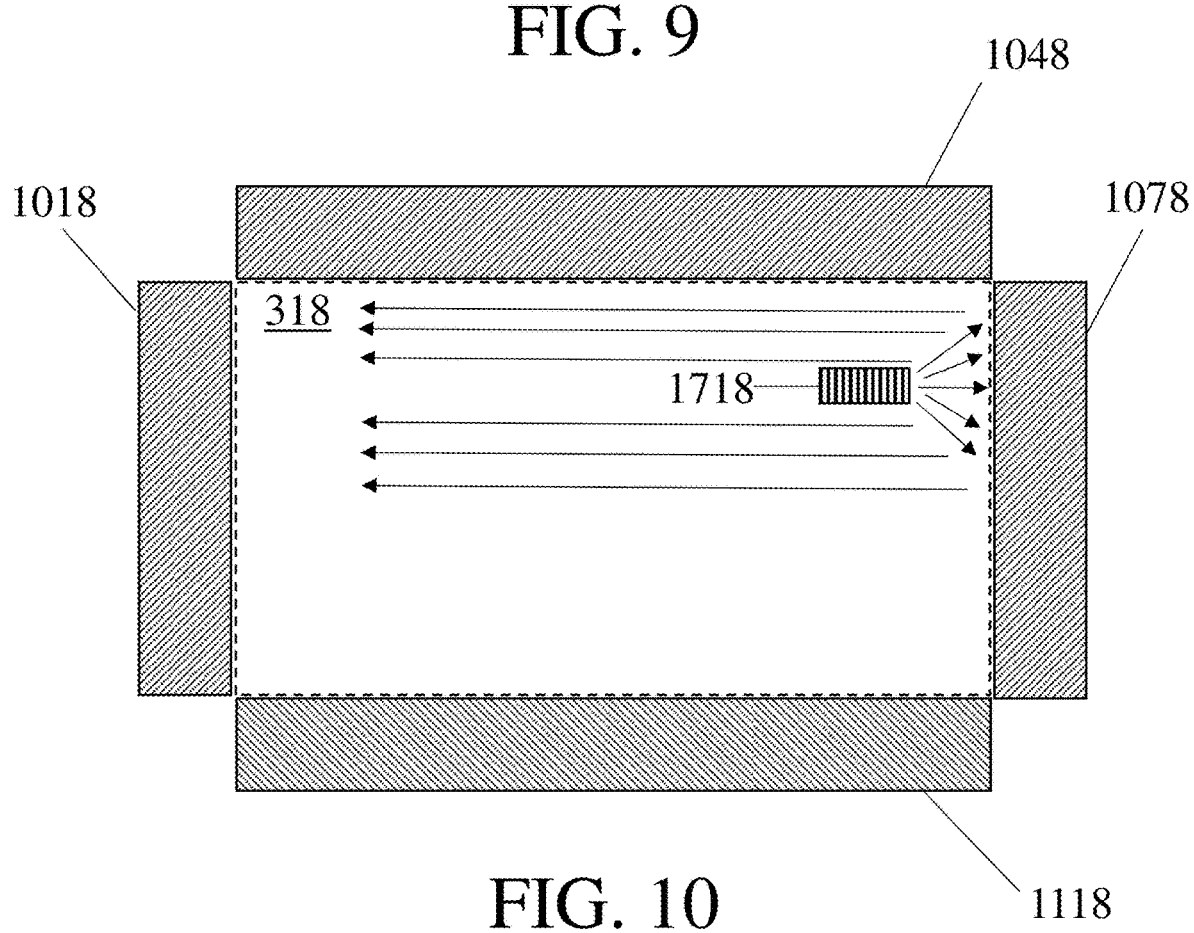
FIG. 10 shows a reaction volume comprising a port, in accordance with some embodiments.

A reaction volume may be configured to allow one-dimensional flow therethrough in a variety of suitable manners. As one example, in some embodiments, one-dimensional flow is obtained by orienting a port in fluidic communication with a source of gas such that the port directs the gas to a wall of the reaction volume positioned proximate the port. It is believed that this design may cause the gas to initially flow outwards in all directions from the port, but then rebound from the wall and flow in substantially one direction (i.e., perpendicular to the wall) after doing so. FIG. 10 shows one non-limiting embodiment of a port positioned in this manner. In FIG. 10, the port 1718 is positioned proximate the wall 1078 of the reaction volume 318. Gas is believed to flow out of the port 1718 in the manner shown by the arrows.

Another example of a manner in which one-dimensional flow may be obtained is by use of a plurality of baffles. The baffles may direct the gas to flow in a one-dimensional manner.

In some embodiments, a reaction volume has a relatively low pressure at one or more points in time. This relatively low pressure may be present at times when, for instance, a reaction (e.g., a reaction to deposit a fluorinated polymeric coating) is performed in the reaction volume. In some embodiments, the pressure in the reaction volume is less than or equal to 100 Torr, less than or equal to 75 Torr, less than or equal to 50 Torr, less than or equal to 20 Torr, less than or equal to 10 Torr, less than or equal to 7.5 Torr, less than or equal to 5 Torr, less than or equal to 2 Torr, less than or equal to 1 Torr, less than or equal to 750 mTorr, less than or equal to 500 mTorr, less than or equal to 200 mTorr, less than or equal to 100 mTorr, less than or equal to 75 mTorr, less than or equal to 50 mTorr, less than or equal to 30 mTorr, less than or equal to 20 mTorr, less than or equal to 10 mTorr, less than or equal to 7.5 mTorr, less than or equal to 5 mTorr, or less than or equal to 2 mTorr. In some embodiments, the pressure in the reaction volume is greater than or equal to 1 mTorr, greater than or equal to 2 mTorr, greater than or equal to 5 mTorr, greater than or equal to 10 mTorr, greater than or equal to 20 mTorr, greater than or equal to 30 mTorr, greater than or equal to 50 mTorr, greater than or equal to 75 mTorr, greater than or equal to 100 mTorr, greater than or equal to 200 mTorr, greater than or equal to 500 mTorr, greater than or equal to 750 mTorr, greater than or equal to 1 Torr, greater than or equal to 2 Torr, greater than or equal to 5 Torr, greater than or equal to 7.5 Torr, greater than or equal to 10 Torr, greater than or equal to 20 Torr, greater than or equal to 50 Torr, or greater than or equal to 75 Torr. Combinations of the above-referenced ranges are also possible (e.g., less than or equal to 100 Torr and greater than or equal to 1 mTorr, or less than or equal to 10 Torr and greater than or equal to 5 mTorr). Other ranges are also possible.

In some embodiments, as described above, a reaction volume includes a relatively low level of air at one or more points in time. This relatively low level of air may be present at times when, for instance, a reaction (e.g., a reaction to deposit a fluorinated polymeric coating) is performed in the reaction volume. In some embodiments, the amount of air in the reaction volume may be in one or more of the ranges described in the preceding paragraph with respect to the total pressure in the reaction volume (e.g., less than or equal to 30 mTorr, less than or equal to 20 mTorr, and/or less than or equal to 10 mTorr).

It is also possible for a reaction volume to include a relatively low level of water. This relatively low level of water may be present at times when, for instance, a reaction (e.g., a reaction to deposit a fluorinated polymeric coating) is performed in the reaction volume. In some embodiments, the amount of water in the reaction volume may be in one or more of the ranges described in the preceding paragraph with respect to the total pressure in the reaction volume (e.g., less than or equal to 30 mTorr, less than or equal to 20 mTorr, and/or less than or equal to 10 mTorr).

It is also possible for a relatively low level of water in the reaction volume to be evidenced by a relatively low level of relative humidity. The relative humidity of the reaction volume may be less than or equal to 0.5%, less than or equal to 0.4%, less than or equal to 0.3%, less than or equal to 0.2%, or less than or equal to 0.1%. The relative humidity of the reaction volume may be greater than or equal to 0%, greater than or equal to 0.1%, greater than or equal to 0.2%, greater than or equal to 0.3%, or greater than or equal to 0.4%. Combinations of the above-referenced ranges are also possible (e.g., less than or equal to 0.5% and greater than or equal to 0%). Other ranges are also possible.

In some embodiments (e.g., during the deposition of a fluorinated polymeric coating therein), a reaction volume may comprise a relatively high amount of monomers and/or of precursors to monomers. In some embodiments, monomers and/or precursors to monomers make up greater than or equal to 1 mol %, greater than or equal to 2 mol %, greater than or equal to 5 mol %, greater than or equal to 7.5 mol %, greater than or equal to 10 mol %, greater than or equal to 15 mol %, greater than or equal to 20 mol %, greater than or equal to 30 mol %, greater than or equal to 40 mol %, greater than or equal to 50 mol %, or greater than or equal to 75 mol % of the gases in the reaction volume. In some embodiments, monomers and/or precursors to monomers make up less than or equal to 100 mol %, less than or equal to 75 mol %, less than or equal to 50 mol %, less than or equal to 40 mol %, less than or equal to 30 mol %, less than or equal to 20 mol %, less than or equal to 15 mol %, less than or equal to 10 mol %, less than or equal to 7.5 mol %, less than or equal to 5 mol %, or less than or equal to 2 mol % of the gases in the reaction volume. Combinations of the above-referenced ranges are also possible (e.g., greater than or equal to 1 mol % and less than or equal to 100 mol %). Other ranges are also possible.

It should be understood that the ranges in the preceding paragraph may independently refer to the amounts of any of the following in the reaction volume: one type of monomer (e.g., in the presence of other types of monomers and/or a precursor to that monomer, in the absence of either or both of such species), all of the monomers together (e.g., in the presence of precursors to one or more of the monomers, in the absence of such species), one type of monomer and its precursor(s) (e.g., in the presence of other types of monomers and/or precursors to other types of monomers, in the absence of either or both of such species), and all of the monomers and all of the precursors to monomers together.

As described elsewhere herein, in some embodiments, the systems described herein are suitable for and/or are employed for creating fluorinated polymeric coatings on substrates. The fluorinated polymeric coatings may be formed by polymerizing gaseous monomers. Further details of this process are provided below.

One or more reactions may take place in the reaction volume to form the fluorinated polymeric coating. As described elsewhere herein, in some embodiments, one such reaction is a polymerization reaction. The polymerization reaction may proceed through a variety of suitable mechanisms. One example of such a mechanism is a chain growth reaction. Another example of such a mechanism is a step group reactions. In chain growth reactions and step growth reactions, a growing polymeric chain comprises one or more reactive species at one or more of its ends. These reactive species may react with monomers, which may then be incorporated into the growing chain and themselves become reactive end groups that may react with further monomers.

In chain growth reactions, the monomers reacting to form the growing polymeric chain may not themselves be reactive with other monomers until activated in some manner (e.g. by being incorporated into the growing polymeric chain and/or by reacting with a species rendering them reactive, such as an initiator). Chain growth may accordingly proceed by growing individual polymeric chains by adding monomers until the reactive end groups are rendered unreactive. This may occur by reaction with another reactive chain (thereby rendering both chains inactive) or with another species that serves to inactivate the end group (e.g., a contaminant, such as oxygen). During the growth of any single chain, new chains may be forming and/or growing and/or the growth of other chains may be terminated. The reactive end groups may be reactive in a variety of ways. As one example, in some embodiments, the reactive end groups comprise free radicals. These free radicals may react with further monomers, and may pass the free radical to the monomers with which they react so that, after the reaction, the end group initially comprising the free radical is rendered unreactive and the newly-added monomer becomes a reactive end group comprising the free radical.

Chain growth reactions may be reactions that begin spontaneously or may be reactions that do not begin spontaneously. Chain growth reactions that occur spontaneously may be reactions in which the monomer spontaneously becomes reactive. As an example, some monomers decompose to and/or undergo a reaction to form a species comprising a reactive species (e.g., a free radical) under the conditions present in a reaction chamber. Chain grown reactions may occur non-spontaneously if one or more of the reactants is provided in precursor form. For instance, in some embodiments, a chain growth reaction may not occur until the decomposition of a precursor to a monomer into the resultant monomer. This decomposition process may be non-spontaneous (e.g., it may require the application of heat, such as heat provided by a heated filament). After decomposition of the precursor to the monomer into the monomer, the resultant monomer may polymerize spontaneously.

It is also possible for a chain growth reaction to require and/or be accelerated by an initiator. An initiator may be a species that readily undergoes a reaction and/or decomposes to form a reactive species (e.g., a species comprising a free radical). The initiator may undergo such a reaction and/or decomposition more readily than any monomer(s) and/or other species also present in the reaction volume. After undergoing the reaction and/or decomposition, the initiator may react with monomers in the same manner described above. Non-limiting examples of suitable initiators include initiators comprising peroxide groups, persulfate groups, and/or azo groups. In some embodiments, an initiator comprises one or more of tert-butyl peroxide and tert-amyl peroxide.

In step growth reactions, the monomers are typically reactive with each other without activation. Step growth reactions may proceed by adding monomers to growing chains, by joining growing chains together, and/or by forming new growing chains by reactions of monomers with each other. None of these processes typically inactivate the growing chains. The reactive end groups and/or monomers may be reactive in a variety of ways. As one example, in some embodiments, the reactive end groups of a growing chain comprise functional groups that are reactive with each other. These functional groups may react with each other to form covalent bonds that become the resultant polymeric chain's backbone. Step growth polymerization typically begins spontaneously, but may be accelerated by the presence of heat and/or any species and/or reaction condition that promotes the reactions between the monomers. It is also possible for a step growth polymerization reaction to not occur spontaneously. As one example, it is possible for a step growth reaction to occur between monomers whose precursors are provided to the reaction volume. In this case, the step growth reaction may not occur until the precursors are decomposed to form the monomers, which may only occur upon the application of energy (e.g., heat provided by a filament).

In some embodiments, one or more reactions other than polymerization reactions may be performed in the reaction volume. As one example, in some embodiments, one or more decomposition reactions are performed in the reaction volume. For instance, a species may be introduced into the reaction volume that is not itself a monomer, but may undergo a decomposition reaction to form a monomer. In some embodiments, the decomposition of a species may be facilitated by one or more conditions present in the reaction volume. As an example, in some embodiments, the presence of heat (e.g., from a heated filament) promotes the decomposition of a precursor into a monomer.

As described elsewhere herein, in some embodiments, a polymerization reaction occurs in the gas phase. The polymerization reaction may result in the formation of a solid, polymeric particle surrounded by gas. In some embodiments, a relatively high percentage of the total polymerization occurring in the reaction volume may be nucleated in the gas phase and/or may result in the production of polymeric particles surrounded by gas. As an example, in some embodiments, greater than or equal to 50%, greater than or equal to 60%, greater than or equal to 80%, greater than or equal to 90%, greater than or equal to 92.5%, greater than or equal to 95%, greater than or equal to 97.5%, greater than or equal to 99%, greater than or equal to 99.5%, or greater than or equal to 99.9% of the total polymerization occurring in the reaction volume is nucleated in the gas phase and/or results in the production of polymeric particles surrounded by gas. In some embodiments, less than or equal to 100%, less than or equal to 99.9%, less than or equal to 99.5%, less than or equal to 99%, less than or equal to 97.5%, less than or equal to 95%, less than or equal to 92.5%, less than or equal to 90%, less than or equal to 80%, or less than or equal to 60% of the total polymerization occurring in the reaction volume is nucleated in the gas phase and/or results in the production of polymeric particles surrounded by gas. Combinations of the above-referenced ranges are also possible (e.g., greater than or equal to 50% and less than or equal to 100%, or greater than or equal to 90% and less than or equal to 100%). Other ranges are also possible.

When present, particles formed by polymerization in the gas phase may have a variety of suitable sizes. In some embodiments, an average diameter of the particles formed in the gas phase is greater than or equal to 0.5 nm, greater than or equal to 0.75 nm, greater than or equal to 1 nm, greater than or equal to 1.5 nm, greater than or equal to 2 nm, greater than or equal to 5 nm, greater than or equal to 10 nm, greater than or equal to 20 nm, greater than or equal to 50 nm, greater than or equal to 75 nm, greater than or equal to 100 nm, greater than or equal to 200 nm, greater than or equal to 500 nm, greater than or equal to 750 nm, greater than or equal to 1 micron, greater than or equal to 2 microns, greater than or equal to 5 microns, greater than or equal to 7.5 microns, greater than or equal to 10 microns, or greater than or equal to 20 microns. In some embodiments, an average diameter of the particles formed in the gas phase is less than or equal to 50 microns, less than or equal to 20 microns, less than or equal to 10 microns, less than or equal to 7.5 microns, less than or equal to 5 microns, less than or equal to 2 microns, less than or equal to 1 micron, less than or equal to 750 nm, less than or equal to 500 nm, less than or equal to 200 nm, less than or equal to 100 nm, less than or equal to 75 nm, less than or equal to 50 nm, less than or equal to 20 nm, less than or equal to 10 nm, less than or equal to 5 nm, less than or equal to 2 nm, less than or equal to 1.5 nm, less than or equal to 1 nm, or less than or equal to 0.75 nm. Combinations of the above-referenced ranges are also possible (e.g., greater than or equal to 0.5 nm and less than or equal to 50 microns, or greater than or equal to 1 nm and less than or equal to 1 micron). Other ranges are also possible.

As also described elsewhere herein, the above-described polymerization reactions may be employed to form a fluorinated polymer, such as a fluorinated polymer that forms when surrounded by a gas and/or deposits to form a coating on a substrate. One example of a suitable fluorinated polymer is poly(tetrafluoroethylene). Another example of a suitable fluorinated polymer is a polymer comprising fluorine functional groups.

The level of fluorination in such polymers may be quantified by the $CF_2$ fraction, which is equivalent to the fraction of repeat units in the polymer that are $CF_2$ groups. In some embodiments, a reaction described herein may result in the formation of a polymer that has a relatively high $CF_2$ fraction. As an example, the $CF_2$ fraction may be greater than or equal to 50%, greater than or equal to 75%, greater than or equal to 90%, and/or greater than or equal to 95%. In some embodiments, the $CF_2$ fraction is less than 100%, less than or equal to 95%, less than or equal to 90%, or less than or equal to 75%. Combinations of the above-referenced ranges are also possible (e.g., greater than or equal to 75% and less than 100%). Other ranges are also possible. The $CF_2$ fraction of a polymer may be determined by XPS.

Another way that the level of fluorination in a polymer may be quantified is by the atomic ratio of fluorine to carbon therein. In some embodiments, a polymer has an atomic ratio of fluorine to carbon of greater than or equal to 1.1, greater than or equal to 1.2, greater than or equal to 1.3, greater than or equal to 1.4, greater than or equal to 1.5, greater than or equal to 1.6, greater than or equal to 1.7, greater than or equal to 1.8, greater than or equal to 1.9, greater than or equal to 2, or greater than or equal to 2.1. In some embodiments, a polymer has an atomic ratio of fluorine to carbon of less than or equal to 2.2, less than or equal to 2.1, less than or equal to 2, less than or equal to 1.9, less than or equal to 1.8, less than or equal to 1.7, less than or equal to 1.6, less than or equal to 1.5, less than or equal to 1.4, less than or equal to 1.3, or less than or equal to 1.2. Combinations of the above-referenced ranges are also possible (e.g., greater than or equal to 1.1 and less than or equal to 2.2). Other ranges are also possible.

In some embodiments, a polymer deposited by a process described herein may undergo one or more further processes after deposition. As one example, in some embodiments, a fluorinated polymer deposited by a process described herein is annealed after being deposited. Annealing the fluorinated polymer may comprise heating the fluorinated polymer. The temperature to which the fluorinated polymer, substrate, and/or environment in which the fluorinated polymer is positioned is heated to may be greater than or equal to 50° C., greater than or equal to 75° C., greater than or equal to 100° C., greater than or equal to 125° C., greater than or equal to 150° C., greater than or equal to 175° C., greater than or equal to 200° C., greater than or equal to 225° C., greater than or equal to 250° C., greater than or equal to 275° C., greater than or equal to 300° C., greater than or equal to 325° C., greater than or equal to 350° C., or greater than or equal to 375° C. The temperature to which the fluorinated polymer, substrate, and/or environment in which the fluorinated polymer is positioned is heated to may be less than or equal to 400° C., less than or equal to 375° C., less than or equal to 350° C., less than or equal to 325° C., less than or equal to 300° C., less than or equal to 275° C., less than or equal to 250° C., less than or equal to 225° C., less than or equal to 200° C., less than or equal to 175° C., less than or equal to 150° C., less than or equal to 125° C., less than or equal to 100° C., or less than or equal to 75° C. Combinations of the above-referenced ranges are also possible (e.g., greater than or equal to 50° C. and less than or equal to 400° C.). Other ranges are also possible.

An annealing step may be performed for a variety of suitable times. In some embodiments, the annealing is performed for a period of time of greater than or equal to 30 minutes, greater than or equal to 1 hour, greater than or equal to 2 hours, greater than or equal to 5 hours, greater than or equal to 10 hours, greater than or equal to 15 hours, greater than or equal to 20 hours, greater than or equal to 24 hours, or greater than or equal to 30 hours. In some embodiments, the annealing is performed for a period of time of less than or equal to 48 hours, less than or equal to 30 hours, less than or equal to 24 hours, less than or equal to 20 hours, less than or equal to 15 hours, less than or equal to 10 hours, less than or equal to 5 hours, less than or equal to 2 hours, or less than or equal to 1 hour. Combinations of the above-referenced ranges are also possible (e.g., greater than or equal to 1 hour and less than or equal to 24 hours). Other ranges are also possible.

Fluorinated polymeric coatings may be annealed in a variety of suitable environments. In some embodiments, the annealing is performed in air. It is also possible for the annealing to be performed in the presence of an inert gas (e.g., nitrogen, helium, argon). The annealing may be performed inside the reaction volume and/or deposition chamber, and/or may be performed after removal of a coated substrate from the reaction volume and/or deposition chamber.

In some embodiments, the processes that are performed in a reaction volume (e.g., polymerization, annealing, etc.) may be automated. Such automation may comprise providing software that reads instructions for the various processes being performed (e.g., the flow rates and/or types of gases introduced into the reaction system, the filament temperature, the temperature of the substrate, etc.) and then executes these instructions by directing further system components to carry them out. As one example, in some embodiments, software may read an excel spreadsheet including various system properties and the amount of time the system should spend in various conditions and/or executing various methods. In some embodiments, instructions, like those provided by an excel spreadsheet, may include instructions that are condition-dependent. For instance, a set of instructions may require the system to be in a certain state and/or delay a certain process until one or more properties of the reaction volume are within a certain range (e.g., the total pressure, the partial pressure of one or more gases, the filament temperature, the filament resistance). As one example, a set of instructions may comprise an instruction to delay the introduction of monomers and/or precursors to monomers until the pressure in the reaction volume is below a set amount. As another example, a set of instructions may comprise an instruction to determine the resistance of the filament prior to the introduction of monomers and/or precursors to monomers and to decline to introduce the monomers and/or precursors to monomers if the resistance is outside of a set range.

As described elsewhere herein, some embodiments relate to the deposition of fluorinated polymeric coatings and/or to fluorinated polymeric coatings. Further details regarding such coatings are provided below.

As one example of a coating property, in some embodiments, a coating is adhered to a substrate on which it is deposited. The strength of adhesion between the coating and the substrate may be relatively strong. For instance, in some embodiments, a coating is adhered to a substrate with a strength of adhesion such that the adhesion score is greater than or equal to 4. The adhesion score may be determined by the procedure described in ASTM D3359.

As another example of a coating property, in some embodiments, a coating may cover a relatively large percentage of a surface of a substrate. As an example, the coating may cover greater than or equal to 50%, greater than or equal to 75%, greater than or equal to 90%, greater than or equal to 95%, greater than or equal to 99%, greater than or equal to 99.5%, greater than or equal to 99.8%, greater than or equal to 99.9%, or greater than or equal to 99.99% of the surface of the substrate. In some embodiments, the coating covers less than or equal to 100%, less than or equal to 99.99%, less than or equal to 99.9%, less than or equal to 99.8%, less than or equal to 99.5%, less than or equal to 99%, less than or equal to 95%, less than or equal to 90%, or less than or equal to 75% of the surface of the substrate. Combinations of the above-referenced ranges are also possible (e.g., greater than or equal to 50% and less than or equal to 100%). Other ranges are also possible.

As described elsewhere herein, some embodiments relate to the deposition of fluorinated polymeric coatings onto substrates and/or to substrates on which a fluorinated polymeric coating is disposed. Further details regarding such substrates are provided below.

The types of substrates that may be coated by the systems and methods described herein may generally be selected as desired. In some embodiments, the substrate comprises a polymeric material (e.g., a plastic, an elastomer). It is also possible for a substrate to be coated to comprise a metal. The substrates may be a variety of suitable articles, non-limiting examples of which include seals, gaskets, o-rings, and molds.

As described elsewhere herein, in some embodiments, a substrate comprises one or more depressions in its surface. The depressions may have any suitable depth. In some embodiments, a substrate comprises depressions having a depth of (and/or comprises depressions having an average depth of) greater than or equal to 0.1 inch, greater than or equal to 0.2 inches, greater than or equal to 0.25 inches, greater than or equal to 0.3 inches, greater than or equal to 0.4 inches, greater than or equal to 0.5 inches, greater than or equal to 0.75 inches, greater than or equal to 1 inch, greater than or equal to 1.5 inches, greater than or equal to 2 inches, greater than or equal to 3 inches, greater than or equal to 4 inches, greater than or equal to 5 inches, greater than or equal to 7.5 inches, greater than or equal to 10 inches, greater than or equal to 12.5 inches, greater than or equal to 15 inches, greater than or equal to 17.5 inches, or greater than or equal to 20 inches. In some embodiments, a substrate comprises depressions having a depth of (and/or comprises depressions having an average depth of) less than or equal to 24 inches, less than or equal to 20 inches, less than or equal to 17.5 inches, less than or equal to 15 inches, less than or equal to 12.5 inches, less than or equal to 10 inches, less than or equal to 7.5 inches, less than or equal to 5 inches, less than or equal to 4 inches, less than or equal to 3 inches, less than or equal to 2 inches, less than or equal to 1.5 inches, less than or equal to 1 inch, less than or equal to 0.75 inches, less than or equal to 0.5 inches, less than or equal to 0.4 inches, less than or equal to 0.3 inches, less than or equal to 0.25 inches, or less than or equal to 0.2 inches. Combinations of the above-referenced ranges are also possible (e.g., greater than or equal to 0.1 inch and less than or equal to 24 inches, or greater than or equal to 0.1 inches and less than or equal to 5 inches). Other ranges are also possible.

In some embodiments, a method comprises causing a substrate to undergo one or more processes prior to the deposition of a fluorinated polymeric coating thereon. One example of such a process is a cleaning process. The cleaning process may comprise removing one or more contaminants from the substrate and/or the substrate surface. The cleaning process may comprise exposing the substrate to a fluid and then immersing and/or soaking the substrate in the fluid, rinsing the substrate with a fluid, and/or sonicating the substrate in the presence of a fluid. In some embodiments, one or more of these processes is followed by an optional heating step and/or an optional drying step (e.g., a drying step in which the substrate is exposed to nitrogen and/or vacuum). Non-limiting examples of suitable fluids for such processes include organic solvents (e.g., isopropyl alcohol, acetone), water, and/or solutions comprising an organic or aqueous solvent and a surfactant. The fluid to which the substrate is exposed may solubilize and/or suspend contaminants present on the substrate and/or its surface, which may remove them therefrom. Another example of a suitable cleaning process comprises exposing the substrate to a plasma to remove contaminants (e.g., surface contaminant(s)) therefrom.

In some embodiments, a method comprises depositing a fluorinated polymeric coating on a substrate shortly after a cleaning process. Without wishing to be bound by any particular theory, it is believed that doing so may be advantageous because it may prevent recontamination of the substrate with contaminants present in the ambient environment after cleaning and prior to deposition of the fluorinated polymeric coating. Depositing a fluorinated polymeric coating on a substrate shortly after a cleaning process is also believed to prevent and/or reduce the amount of internal contaminants transported to the surface of the substrate after cleaning. For instance, it is believed that some substrates may comprise low molecular weight contaminants throughout their interiors (e.g., small molecules, oligomers, low molecular weight polymers, processing aids, chemicals compounded with the substrate), and that removing such contaminants from the surface may cause transport of such contaminants over time from the substrate interiors to the substrate surfaces by diffusion. As low molecular weight contaminants present at the surface of a substrate are believed to disadvantageously interfere with the adhesion between a fluorinated polymeric coating deposited thereon and the substrate, preventing such transport may enhance the adhesion of the fluorinated polymeric coating to the substrate.

In some embodiments, a method comprises depositing a fluorinated polymeric coating on a substrate within 2 hours, within 1.5 hours, within 1.25 hours, within 1 hour, within 45 minutes, within 30 minutes, within 25 minutes, within 20 minutes, within 15 minutes, within 10 minutes, or within 5 minutes after a cleaning process is performed. The delay between the cleaning process and the deposition of the fluorinated polymeric coating may be at least 0 minutes, at least 5 minutes, at least 10 minutes, at least 15 minutes, at least 20 minutes, at least 25 minutes, at least 30 minutes, at least 45 minutes, at least 1 hour, at least 1.25 hours, or at least 1.5 hours. Combinations of the above-referenced ranges are also possible (e.g., within a period of time between 0 minutes and 2 hours, or within a period of time between 0 minutes and 30 minutes). Other ranges are also possible.

In some embodiments, a method may comprise treating a substrate surface prior to depositing a fluorinated polymeric coating thereon to promote adhesion of the fluorinated polymeric coating thereto with an adhesion promoter. In such embodiments, the adhesion promoter can be vapor-deposited in situ in the reaction volume prior to deposition of the fluorinated polymeric coating. Examples of suitable adhesion promoters include 1H,1H,2H,2H-Perfluorodecyltriethoxysilane, 1H,1H,2H,2H-Perfluorooctyltriethoxysilane, 1H,1H, 2H,2H-Perfluoroalkyltriethoxysilane, perfluorooctyltrichlorosilane, and all classes of vinyl silanes.

It is also possible for a substrate to be heated (e.g., to a temperature of between 20° C. and 300° C.) and/or exposed to a source of vacuum (e.g., to bring the pressure in the environment surrounding the substrate to between 0.1 mTorr and 760 Torr) prior to depositing a fluorinated polymeric coating thereon.

Some substrates may comprise one or more volatile components when introduced into a reaction volume. The volatile components may outgas during deposition of a fluorinated polymer coating onto the substrate. In some embodiments, the amount of gas outgassed from the substrate during the deposition of the fluorinated polymeric coating may be relatively high. Without wishing to be bound by any particular theory, it is believed that some features of the methods described herein may facilitate the deposition of fluorinated polymeric coatings having advantageous properties in the presence of an appreciable amount of gas outgassed from a substrate.

As one example, it is believed that outgassing gases unreactive with the other gases present in the reaction volume may have small or no effects on the fluorinated polymeric coatings deposited on the substrate. For instance, outgassing gases unreactive with the monomers and/or precursors to monomers reacting to form the fluorinated polymeric coating may be relatively benign, especially when the other gases present in the reaction volume are inert gases.

As another example, it is believed that outgassing gases in the presence of a filament kept at a relatively low temperature may have small or no effects on the fluorinated polymeric coatings deposited on the substrate, as a filament kept at a relatively low temperature may not provide sufficient energy to catalyze a reaction of a gas outgassing from a substrate.

As a third example, it is believed that outgassing gases from a substrate may have small or no effects on the fluorinated polymeric coatings deposited on the substrate when the outgassing occurs in the presence of a large volume of other gases (e.g., a large volume of monomers, precursors to monomers, and/or inert gases) and/or at high flow rates of other gases (e.g., high flow rates of monomers, precursors to monomers, and/or inert gases) through the reaction volume. In such conditions, the gas outgassing from the substrate may make up a relatively small amount of the total amount of gas in the reaction volume, and so may have a proportionately small effect on the reactions occurring therein.

Non-limiting examples of gases that may be outgassed from a substrate during deposition of a fluorinated polymeric coating thereon include water and air.

In some embodiments, gases outgassed from the substrate make up greater than or equal to 0.01 mol %, greater than or equal to 0.02 mol %, greater than or equal to 0.05 mol %, greater than or equal to 0.075 mol %, greater than or equal to 0.1 mol %, greater than or equal to 0.2 mol %, greater than or equal to 0.5 mol %, greater than or equal to 0.75 mol %, greater than or equal to 1 mol %, greater than or equal to 2 mol %, greater than or equal to 5 mol %, greater than or equal to 7.5 mol %, greater than or equal to 10 mol %, greater than or equal to 12.5 mol %, greater than or equal to 15 mol %, greater than or equal to 17.5 mol %, greater than or equal to 20 mol %, or greater than or equal to 22.5 mol % of the gases present in the reaction volume during the deposition of the coating. In some embodiments, gases outgassed from the substrate make up less than or equal to 25 mol %, less than or equal to 22.5 mol %, less than or equal to 20 mol %, less than or equal to 17.5 mol %, less than or equal to 15 mol %, less than or equal to 12.5 mol %, less than or equal to 10 mol %, less than or equal to 7.5 mol %, less than or equal to 5 mol %, less than or equal to 2 mol %, less than or equal to 1 mol %, less than or equal to 0.75 mol %, less than or equal to 0.5 mol %, less than or equal to 0.2 mol %, less than or equal to 0.1 mol %, less than or equal to 0.075 mol %, less than or equal to 0.05 mol %, or less than or equal to 0.02 mol % of the gases present in the reaction volume during the deposition of the coating. Combinations of the above-referenced ranges are also possible (e.g., greater than or equal to 0.01 mol % and less than or equal to 25 mol %, or greater than or equal to 0.1 mol % and less than or equal to 10 mol %). Other ranges are also possible.

Some embodiments may relate to methods in which the systems described herein are maintained at or close to their optimal performance. It is also possible for this performance to be maintained while simultaneously reducing the effort of the operators of the systems to do so. This may be accomplished by use of automated software that records one or more conditions of the system and then alerts the operator when one or more such conditions indicates that carrying out one or more maintenance steps would improve system performance. Such system conditions may include the amount of time required for exposure to a source of vacuum to cause the reaction volume to reach a desired pressure, the state of any valves positioned between any sources and the reaction volume (e.g., a valve, such as a throttle valve, positioned between a source of vacuum and the reaction volume), the amount of time since a prior maintenance step, the amount of time the system has been employed to deposit fluorinated polymeric coatings, the amount of gases that have passed through the system, the amount of time that one or more filament(s) have been resistively heated, etc.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
applying a voltage and a tensile force to a filament taking the form of a wire made of a material, wherein:
the wire is positioned in a reaction volume comprising at most 10 mTorr of air and comprising hexafluoropropylene oxide vapor;
the reaction volume is positioned in a deposition chamber;
the voltage causes the wire to increase in temperature;
the wire heats the hexafluoropropylene oxide vapor, thereby causing it to decompose;
wherein the reaction volume has a total pressure of less than or equal to 100 Torr and greater than or equal to 1 mTorr;
wherein the temperature of the wire is greater than or equal to 150° C. and less than or equal to 1500° C.; and
wherein a ratio of the applied tensile force to a rated tensile strength of the material forming the wire is greater than or equal to 0.6 and less than or equal to 0.8 at the temperature of the wire.

2. The method of claim 1, further comprising:
sensing a resistance of the wire; and
if the sensed resistance of the wire is greater than or equal to 101% or less than or equal to 99% of a set point, and
if the sensed resistance of the wire differs by greater than or equal to 0.1% of the set point or less than or equal to 5% of the set point,
adjusting the voltage applied to the wire in order to maintain the temperature of the wire within the temperature range of greater than or equal to 150° C. and less than or equal to 1500° C.

3. The method of claim 2, further comprising:
providing a warning, if the sensed resistance of the wire is greater than or equal to 101% or less than or equal to 99% of the set point.

4. The method of claim 1, wherein an amount of hexafluoropropylene oxide vapor in the reaction volume is greater than or equal to 1 mol % and less than or equal to 100 mol % of the gases present in the reaction volume.

5. The method of claim 1, wherein the reaction volume further comprises one or more carrier gasses.

6. The method of claim 5, wherein the one or more carrier gasses are an inert gas.

7. The method of claim 1, wherein the total pressure is greater than or equal to 1 mTorr and less than or equal to 10 Torr.

8. The method of claim 1, wherein the reaction volume comprises a plurality of filaments taking the form of wires.

9. The method of claim 8, wherein an average distance between the wires is greater than or equal to 0.1 inch and less than or equal to 2.5 inches.

10. The method of claim 8, wherein the average distance between the wires and the base of the reaction volume is greater than or equal to 0.1 inch and less than or equal to 24 inches.

11. The method of claim 8, wherein the average distance between the wires and the base of the reaction volume is greater than or equal to 0.25 inches and less than or equal to 5 inches.

12. The method of claim 2, wherein the voltage adjustment applied is made by a proportional-integral-derivative controller.

13. The method of claim 1, the wherein ratio of the applied tensile force to the rated tensile strength of the material forming the wire is greater than or equal to 0.7 and less than or equal to 0.8 at a temperature of the filament.

14. The method of claim 5, wherein the one or more carrier gasses having a one-dimensional flow which occurs across at least the top 25% and no more than the top 95% of the reaction volume.

* * * * *